(12) United States Patent
Kodama

(10) Patent No.: US 7,960,087 B2
(45) Date of Patent: Jun. 14, 2011

(54) POSITIVE PHOTOSENSITIVE COMPOSITION AND PATTERN-FORMING METHOD USING THE SAME

(75) Inventor: Kunihiko Kodama, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 183 days.

(21) Appl. No.: 11/370,983

(22) Filed: Mar. 9, 2006

(65) Prior Publication Data

US 2006/0204890 A1    Sep. 14, 2006

(30) Foreign Application Priority Data

Mar. 11, 2005   (JP) .............................. P. 2005-068920

(51) Int. Cl.
*G03F 7/039* (2006.01)
*G03F 7/028* (2006.01)

(52) U.S. Cl. ..................... 430/270.1; 430/326; 430/919; 430/322

(58) Field of Classification Search ............... 430/270.1, 430/326, 325, 919, 920, 921, 925
See application file for complete search history.

(56) References Cited

U.S. PATENT DOCUMENTS

| | | | |
|---|---|---|---|
| 5,554,664 A * | 9/1996 | Lamanna et al. ............... 522/25 |
| 6,388,101 B1 | 5/2002 | Hada et al. | |
| 6,720,430 B2 | 4/2004 | Chen et al. | |
| 6,746,818 B2 | 6/2004 | Kinsho et al. | |
| 2002/0163629 A1 * | 11/2002 | Switkes et al. .................. 355/53 |
| 2003/0008232 A1 | 1/2003 | Kinsho et al. | |
| 2003/0008241 A1 | 1/2003 | Sato et al. | |
| 2003/0148221 A1 | 8/2003 | Okamoto | |
| 2003/0207201 A1 | 11/2003 | Hatakeyama et al. | |
| 2004/0063882 A1 | 4/2004 | Kamon et al. | |
| 2004/0241569 A1 | 12/2004 | Chen et al. | |
| 2006/0194141 A1 | 8/2006 | Hada et al. | |
| 2007/0065748 A1 | 3/2007 | Hada et al. | |
| 2007/0275307 A1 | 11/2007 | Hada et al. | |

FOREIGN PATENT DOCUMENTS

| | | |
|---|---|---|
| EP | 1 352 904 A1 | 10/2003 |
| JP | 2003-261529 A | 9/2003 |
| JP | 2004-182890 * | 7/2004 |
| JP | 2004-300403 A | 10/2004 |
| JP | 2005-042092 A | 2/2005 |
| JP | 2005-173468 A | 6/2005 |
| JP | 2005-196095 A | 7/2005 |
| JP | 2005-206775 A | 8/2005 |
| WO | WO 2004/011509 * | 2/2004 |

OTHER PUBLICATIONS

European Search Report dated Jul. 28, 2006.
Office Action issued Aug. 31, 2010, in counterpart Japanese Application No. 2006-066355.

* cited by examiner

*Primary Examiner* — Cynthia H Kelly
*Assistant Examiner* — Anca Eoff
(74) *Attorney, Agent, or Firm* — Sughrue Mion, PLLC

(57) ABSTRACT

A positive photosensitive composition comprising: (A) a resin having at least one repeating unit having a specific lactone structure at a side chain and being capable of decomposing by the action of an acid to increase the solubility in an alkali developer; and (B) a compound capable of generating a specific acid upon irradiation with an actinic ray or a radiation, and a pattern-forming method using the positive photosensitive composition, are provided.

12 Claims, 1 Drawing Sheet

POSITIVE PHOTOSENSITIVE COMPOSITION AND PATTERN-FORMING METHOD USING THE SAME

BACKGROUND OF THE INVENTION

1. Field of the Invention

The present invention relates to a positive photosensitive composition used in a manufacturing process of semiconductor, such as IC, manufacture of circuit substrates for liquid crystals, thermal heads and the like, and other photo-fabrication processes, and a pattern-forming method using the same. More specifically, the invention relates to a positive photosensitive composition suitable for use in cases where an exposure source of far ultraviolet rays of wavelengths of 220 nm or shorter and an irradiation source of electron beams are used, and a pattern-forming method using the same.

2. Background Art

Chemical amplification photosensitive compositions are pattern-forming materials capable of generating an acid at an exposed area irradiated with radiation such as far ultraviolet rays, changing the solubility in a developing solution between the irradiated area with the actinic radiation and the non-irradiated area by reaction with the acid as a catalyst, and forming a pattern on a substrate.

In a case where a KrF excimer laser is used as an exposure light source, since resins having poly(hydroxystyrene) small in absorption in the region of 248 nm as a fundamental skeleton are mainly used, a good pattern having high sensitivity and high resolution can be formed as compared with the conventional naphthoquinonediazide/novolak resins.

On the other hand, when a light source of a shorter wavelength, e.g., an ArF excimer laser (193 nm), is used as an exposure light source, even the chemical amplification series resists are not sufficient, since compounds containing an aromatic group substantially show large absorption in the region of 193 nm.

Therefore, resists containing a resin having an alicyclic hydrocarbon structure have been developed for an ArF excimer laser.

Further, it has been found that by the introduction of a repeating unit having a lactone structure into the resins having an alicyclic hydrocarbon structure, the performances of the resins are improved. There are disclosed in patent literature 1 (JP-A-9-73173 (the term "JP-A" as used herein refers to an "unexamined published Japanese patent application") and patent literature 2 (U.S. Pat. No. 6,388,101B) resist compositions using resins containing repeating units having a mevalonic lactone structure and a γ-lactone structure, and in patent literature 3 (U.S. Patent 2004-63,882A), patent literature 4 (U.S. Pat. No. 6,746,818B), and patent literature 5 (U.S. Pat. No. 6,720,430B), resist compositions using resins containing a repeating unit having an alicyclic lactone structure are disclosed.

As for acid generators that are the main constituents of chemical amplification resist compositions, also, various kinds of compounds have been found and compounds capable of decomposing and generating a sulfonic acid upon irradiation with actinic rays are generally used. Further, as compounds that generate acids other than a sulfonic acid, photosensitive compositions containing a sulfonium salt or an iodonium salt having a bissulfonyl imide anion or a trissulfonyl methide anion are disclosed in patent literature 6 (JP-A-2002-268223), patent literature 7 (JP-A-2003-261529), and patent literature 8 (U.S. patent 2003-148,221A).

However, from the viewpoint of synthetic performances as resists, it is really very difficult to find combinations of resins, light-acid generators, additives and solvents to be used, and further, in forming a pattern having a line width as fine as of 100 nm or less, a line pattern formed collapses even if resolution performance is excellent. Accordingly, the improvements of the problem of pattern collapse that causes defects in manufacture of devices and the performance of line edge roughness of a line pattern have been required.

Here, line edge roughness means that the edge of the interface between the line pattern of a resist and a substrate presents an irregular form distorted perpendicularly to the line direction, attributing to the characteristics of the resist. When this pattern is observed from right above, the edge looks unevenly (± several nm to several ten nm or so). Since this unevenness is transferred to a substrate by etching processing, electric characteristic failure is caused if the unevenness is great, which results in the reduction of yield.

SUMMARY OF THE INVENTION

Accordingly, an object of the invention is to provide a positive photosensitive composition excellent in resolution and improved in line edge roughness and pattern collapse even in forming a fine pattern of a line width of 10 nm or less, and another object is to provide a pattern-forming method using the same.

The above objects of the invention have been achieved by the positive photosensitive composition having the following structure and the pattern-forming method using the same.

(1) A positive photosensitive composition comprising:

(A) a resin having at least one repeating unit having a lactone structure at a side chain and being capable of decomposing by the action of an acid to increase the solubility in an alkali developer, in which the lactone structure is represented by any of the following formulae (I-1) to (I-4); and (B) a compound capable of generating an acid represented by the following formula (II-1) or (II-2) upon irradiation with an actinic ray or a radiation,

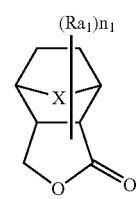

(I-1)

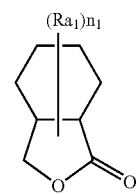

(I-2)

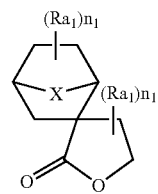

(I-3)

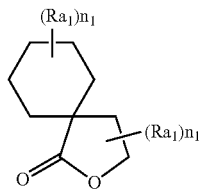
(I-4)

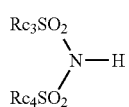
(II-1)

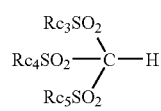
(II-2)

in formulae (I-1) to (I-4), $Ra_1$ each represents an organic group; X represents —$CH_2$—, —$CH_2CH_2$—, or an oxygen atom; and $n_1$ represents an integer of from 0 to 3;

in formulae (II-1) and (II-2), $Rc_3$, $Rc_4$ and $Rc_5$ each represents an organic group, and $Rc_3$ and $Rc_4$ may be bonded to form a ring.

(2) The positive photosensitive composition as described in the above item (1), wherein the resin (A) is a resin having at least one repeating unit having a structure represented by any of the following formulae (I-1a) to (I-4a):

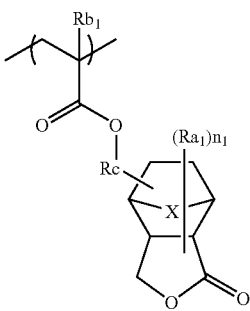
(I-1a)

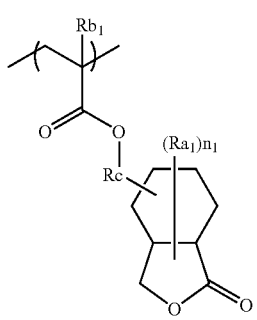
(I-2a)

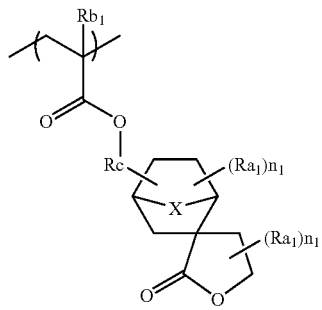
(I-3a)

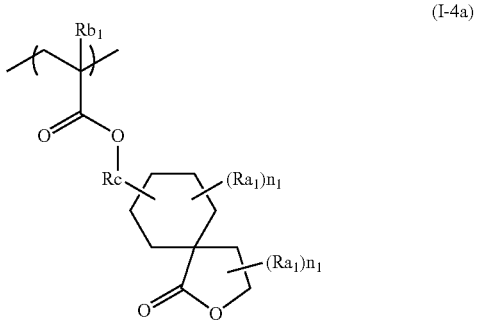
(I-4a)

in formulae (I-1a) to (I-4a), $Rb_1$ represents a hydrogen atom, an alkyl group, or —$CH_2$—O—$Rb_2$; $Rb_2$ represents a hydrogen atom, an alkyl group, a cycloalkyl group, an acyl group, or a group having a lactone structure; Rc represents a single bond or a divalent linking group; $Ra_1$ represents an organic group; X represents —$CH_2$—, —$CH_2CH_2$—, or an oxygen atom; and $n_1$ represents an integer of from 0 to 3.

(3) The positive photosensitive composition as described in the item (1) or (2), wherein the compound (B) is a sulfonium salt or an iodonium salt of the acid represented by formula (II-1) or (II-2).

(4) The positive photosensitive composition as described in the item (1), (2) or (3), wherein the compound of component (B) is a compound capable of generating an acid represented by formula (II-1) or (II-2) in which $Rc_3$ and $Rc_4$ are bonded to each other and forming a ring.

(5) The positive photosensitive composition as described in any of the items (1) to (4), which further comprises a compound capable of generating a sulfonic acid upon irradiation with an actinic ray or a radiation.

(6) The positive photosensitive composition as described in any of the items (1) to (5), wherein the resin (A) contains at least one acid-decomposable repeating unit selecting from the group consisting of a repeating unit represented by the following formula (X-1a) and a repeating unit represented by the following formula (X-1b):

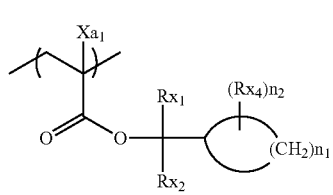
(X-1a)

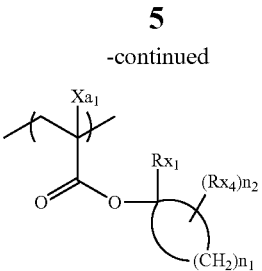

(X-1b)

wherein $Xa_1$ represents a hydrogen atom, an alkyl group, a cyano group or halogen atom; $Rx_1$ and $Rx_2$ each independently represents a straight chain or branched alkyl group, or monocyclic or polycyclic alkyl group; $Rx_4$ represents a straight chain or branched alkyl group, or a monocyclic alkyl group; $n_1$ represents an integer of 4 or 5; and $n_2$ represents an integer of from 0 to 3.

(7) The positive photosensitive composition as described in the item (6), wherein the resin (A) further contains at least one acid-decomposable repeating unit having an adamantane structure.

(8) The positive photosensitive composition as described in any of the items (1) to (7), wherein the resin (A) further contains a repeating unit having an alkali-soluble group.

(9) The positive photosensitive composition as described in any of the items (1) to (8), wherein the resin (A) further contains a repeating unit having from 1 to 3 groups represented by formula (F1):

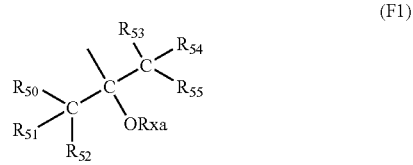

(F1)

wherein $R_{50}$, $R_{51}$, $R_{52}$, $R_{53}$, $R_{54}$ and $R_{55}$ each represents a hydrogen atom, a fluorine atom; or an alkyl group, provided that at least one of $R_{50}$ to $R_{55}$ represents a fluorine atom, or an alkyl group in which at least one hydrogen atom is substituted with a fluorine atom; and Rxa represents a hydrogen atom or an organic group.

(10) A pattern-forming method comprising: forming a film with the positive photosensitive composition as described in any of the items (1) to (9); and exposing and developing the film.

The invention can provide a positive photosensitive composition excellent in resolution and improved in line edge roughness and pattern collapse even in forming a fine pattern of a line width of 10 nm or less, and a pattern-forming method using the same.

DESCRIPTION OF REFERENCE NUMERALS

Figure 1:
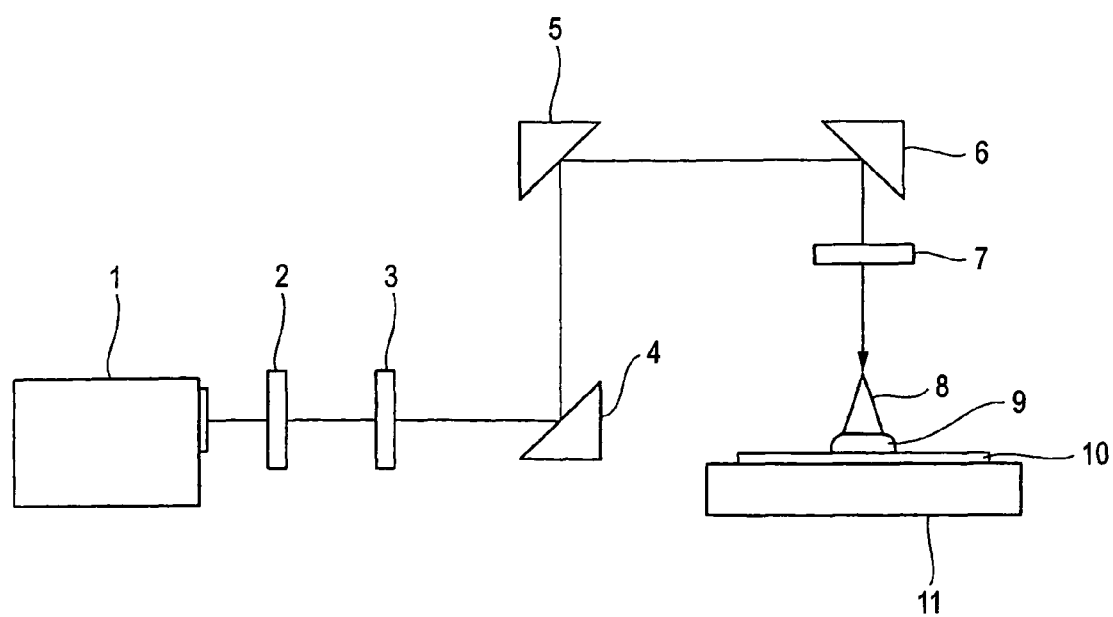
FIG. 1 is a schematic drawing of a laboratory apparatus of two-beam interference exposure.

1: Laser
2: Diaphragm
3: Shutter
4, 5, 6: Reflection mirrors
7: Condenser lens
8: Prism
9: Immersion liquid
10: Wafer provided with an anti-reflection film and a resist film
11: Wafer stage

DETAILED DESCRIPTION OF THE INVENTION

In the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).

The invention will be described in detail below.

[1] (A) A resin having at least one repeating unit having a lactone structure represented by any of formulae (I-1) to (I-4) at a side chain and capable of decomposing by the action of an acid to increase the solubility in an alkali developer:

The positive photosensitive composition of the invention contains a resin having at least one repeating unit having a lactone structure represented by any of the following formulae (I-1) to (I-4) at a side chain and capable of decomposing by the action of an acid to increase the solubility in an alkali developer (hereinafter also referred to as "acid-decomposable resin").

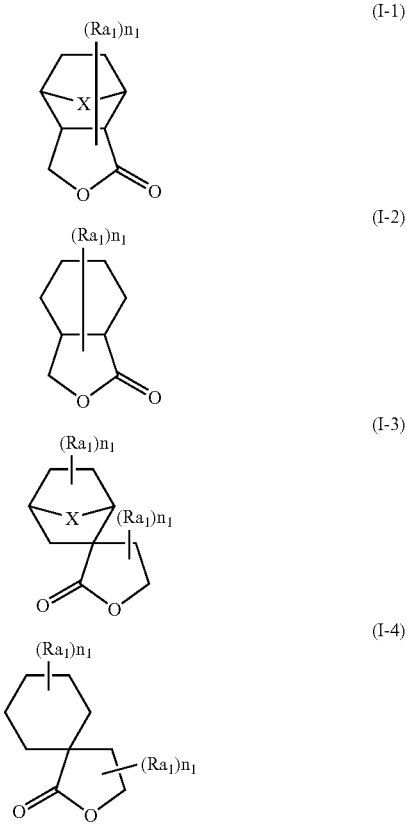

In formulae (I-1) to (I-4), $Ra_1$ each represents an organic group; X represents $-CH_2-$, $-CH_2CH_2-$, or an oxygen atom; and $n_1$ represents an integer of from 0 to 3.

As the organic group represented by $Ra_1$, preferably an alkyl group, a cycloalkyl group, an alkoxyl group, an alkoxycarbonyl group, a carboxyl group, and a cyano group are exemplified.

As the alkyl group of the organic group represented by $Ra_1$, an alkyl group having from 1 to 20 carbon atoms is exemplified, e.g., a straight chain or branched cyclic alkyl group, such as a methyl group, an ethyl group, a propyl group, an isopropyl group, a butyl group, a t-butyl group, an octyl group, and a dodecyl group are exemplified.

As the cycloalkyl group of the organic group represented by $Ra_1$, a cycloalkyl group having from 3 to 20 carbon atoms is exemplified, e.g., a monocyclic cycloalkyl group, such as a cyclopentyl group and a cyclohexyl group, and a polycyclic cycloalkyl group, such as an adamantyl group, a norbornyl group and a tetracyclodecanyl group are exemplified.

As the alkoxyl group, the above alkyl group and cycloalkyl group having an oxygen atom bonded as a linking group are exemplified.

As the alkoxycarbonyl group, the above alkyl group and cycloalkyl group having an —O—C(=O)— group bonded as a linking group are exemplified.

When $n_1$ represents 2 or more, a plurality of $Ra_1$ may be the same or different, and a plurality of $Ra_1$ may be bonded to each other to form a cyclic structure.

The specific examples of the lactone structures represented by formulae (I-1) to (I-4) are shown below.

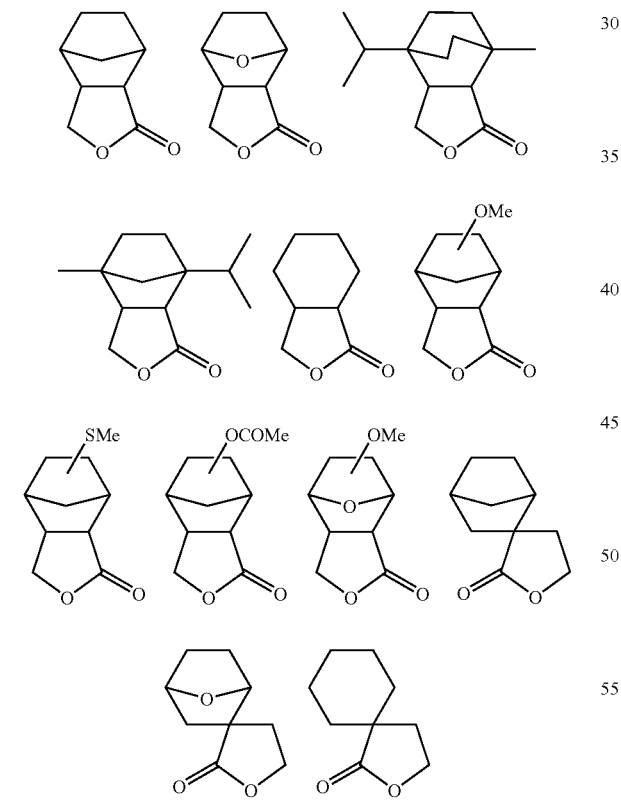

As the repeating unit having a lactone structure represented by any of formulae (I-1) to (I-4) at a side chain, (meth)acrylate repeating units are preferred, and repeating units having a structure represented by any of the following formulae (I-1a) to (I-4a) are more preferred.

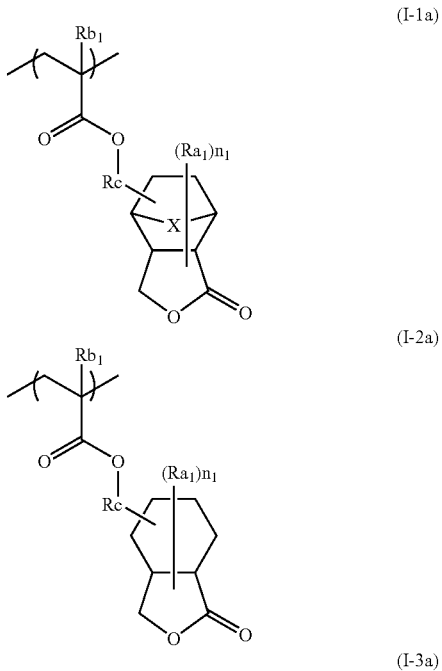

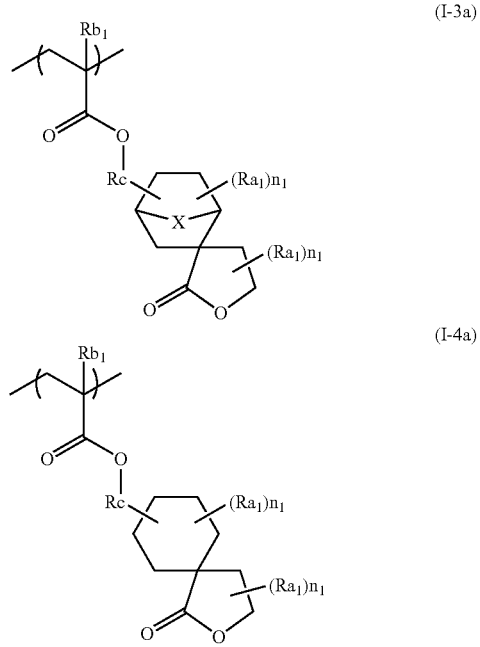

In formulae (I-1a) to (I-4a), $Rb_1$ represents a hydrogen atom, an alkyl group, or —$CH_2$—O—$Rb_2$; $Rb_2$ represents a hydrogen atom, an alkyl group, a cycloalkyl group, an acyl group, or a group having a lactone structure; Rc represents a single bond or a divalent linking group; $Ra_1$ each represents an organic group; X represents —$CH_2$—, —$CH_2CH_2$—, or an oxygen atom; and $n_1$ represents an integer of from 0 to 3.

The alkyl group and the cycloalkyl group represented by $Rb_1$ and $Rb_2$, the same groups as described in $Ra_1$ are exemplified.

As the divalent linking group represented by Rc, an alkylene group, a monocyclic or polycyclic cycloalkylene group, an O—C(=O)— bond, an —O— bond, and linking groups obtained by the combination of a plurality of these groups can be exemplified, preferably an alkylene-carboxyl linking group and a cycloalkylene-carboxyl linking group obtained by linking an alkylene group or a cycloalkylene group and a —CO$_2$— group, and more preferably polycyclic cycloalkylene-carboxyl linking groups are exemplified. Specifically, an adamantyl-carboxyl linking group and a norbornane-carboxyl linking group are exemplified. By the introduction of a polycyclic cycloalkyl structure, dry etching resistance can be heightened.

As Rc, a single bond is also preferred. By making Rc a single bond, the glass transition temperature of the resin can be adjusted to a proper temperature, so that exposure latitude can be improved.

The specific examples of repeating units having a lactone structure represented by any of formulae (I-1) to (I-4) at a side chain are shown below.

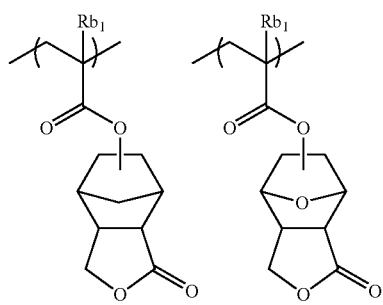

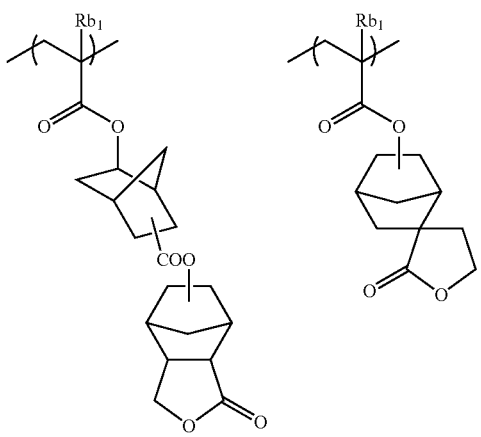

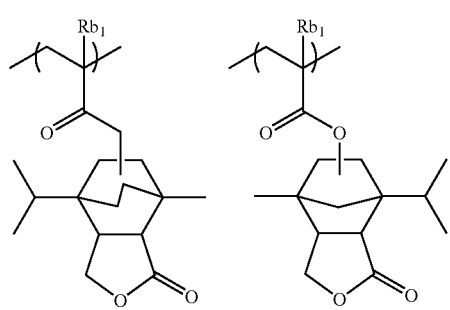

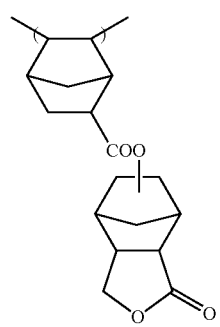

A resin having a repeating unit having a lactone structure represented by any of formulae (I-1) to (I-4) at a side chain can be obtained by polymerization of a corresponding monomer. The corresponding monomer can be synthesized in accordance with well-known methods and, for example, the following methods are known.

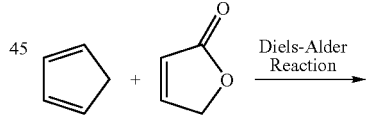

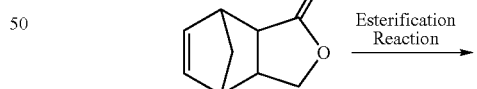

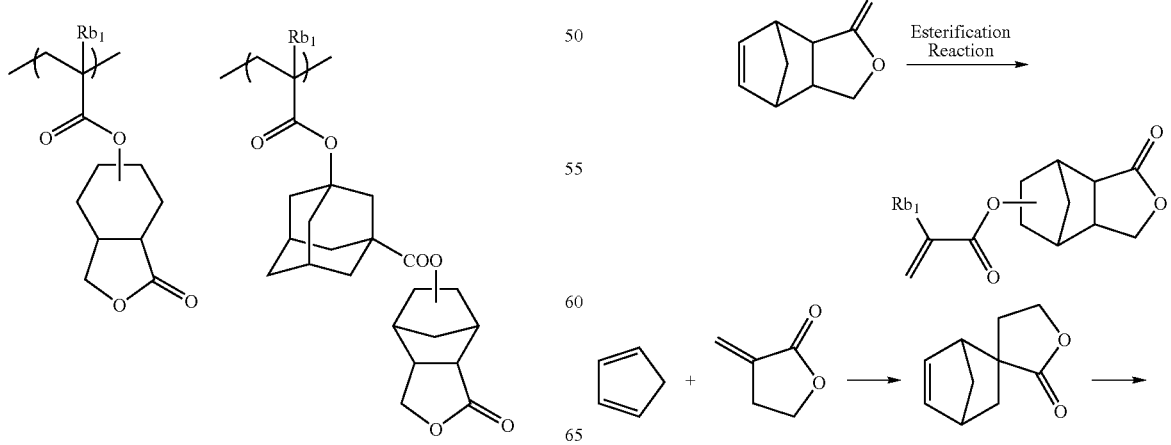

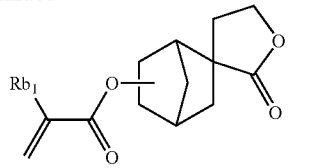

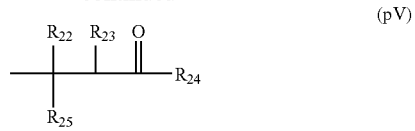

In addition to at least one repeating unit having a lactone structure represented by any of formulae (I-1) to (I-4) at a side chain, the acid-decomposable resin has other repeating units. As other repeating units, e.g., a repeating unit having an acid-decomposable group, a repeating unit containing alicyclic hydrocarbon, a repeating unit having a lactone structure other than a lactone structure represented by any of formulae (I-1) to (I-4), a repeating unit having an alicyclic hydrocarbon structure substituted with a polar group, and a repeating unit having an alkali-soluble group are exemplified.

The acid-decomposable resin in the invention has a group capable of decomposing by the action of an acid to increase the solubility in an alkali developer (an acid-decomposable group).

As the acid-decomposable groups, groups obtained by protecting the hydrogen atoms of alkali-soluble groups, such as a carboxylic acid group, a sulfonic acid group, a phenol group and a thiol group, with a group that is desorbed by the action of an acid can be exemplified.

As the group that is desorbed by the action of an acid, e.g., —C($R_{36}$)($R_{37}$)($R_{38}$) and —C($R_{01}$)($R_{02}$)(O$R_{39}$) are exemplified.

In the above formulae, $R_{36}$, $R_{37}$, $R_{38}$ and $R_{39}$ each represents an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each represents a hydrogen atom, an alkyl group, a cycloalkyl group, an aryl group, an aralkyl group, or an alkenyl group.

The acid-decomposable resin in the invention is preferably a resin having at least a repeating unit selected from the group consisting of repeating units having a partial structure containing an alicyclic hydrocarbon represented by any of the following formulae (pI) to (pV), and a repeating unit represented by the following formula (II-AB).

In formulae (pI) to (pV), $R_{11}$ represents a methyl group, an ethyl group, an n-propyl group, an isopropyl group, an n-butyl group, an isobutyl group, or a sec-butyl group, and Z represents an atomic group necessary to form a cycloalkyl group with a carbon atom.

$R_{12}$, $R_{13}$, $R_{14}$, $R_{15}$ and $R_{16}$ each represents a straight chain or branched alkyl or cycloalkyl group having from 1 to 4 carbon atoms, provided that at least one of $R_{12}$ to $R_{14}$, or either $R_{15}$ or $R_{16}$ represents a cycloalkyl group.

$R_{17}$, $R_{18}$, $R_{19}$, $R_{20}$ and $R_{21}$ each represents a hydrogen atom, a straight chain or branched alkyl or cycloalkyl group having from 1 to 4 carbon atoms, provided that at least one of $R_{17}$ to $R_{21}$ represents a cycloalkyl group, and either $R_{19}$ or $R_{2}$, represents a straight chain or branched alkyl or cycloalkyl group having from 1 to 4 carbon atoms.

$R_{22}$, $R_{23}$, $R_{24}$ and $R_{25}$ each represents a hydrogen atom, a straight chain or branched alkyl or cycloalkyl group having from 1 to 4 carbon atoms, provided that at least one of $R_{22}$ to $R_{25}$ represents a cycloalkyl group, and $R_{23}$ and $R_{24}$ may be bonded to each other to form a ring.

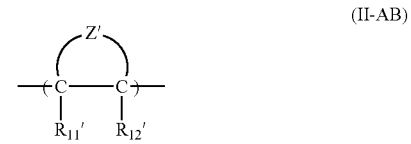

In formula (II-AB), $R_{11}'$ and $R_{12}'$ each represents a hydrogen atom, a cyano group, a halogen atom, or an alkyl group; and Z' contains bonded two carbon atoms (C—C) and represents an atomic group to form an alicyclic structure.

Formula (II-AB) is more preferably represented by the following formula (II-AB1) or

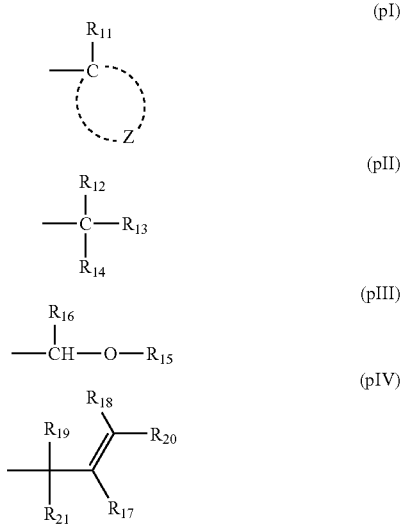

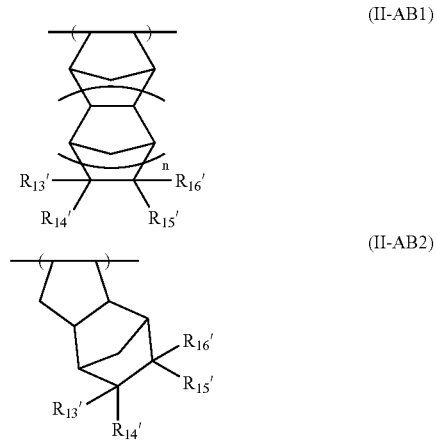

In formulae (II-AB1) and (II-AB2), $R_{13}'$, —$R_{14}'$, $R_{15}'$ and $R_{16}'$ each represents a hydrogen atom, a halogen atom, a cyano group, —COOH, —COO$R_5$, a group decomposable by the action of an acid, —C(=O)—X-A'-$R_{17}'$, an alkyl group, or a cycloalkyl group. At least two of $R_{13}'$ to $R_{16}'$ may be bonded to each other to form a ring.

$R_5$ represents an alkyl group, a cycloalkyl group, or a group having a lactone structure.

X represents an oxygen atom, a sulfur atom, —NH—, —NHSO$_2$— or —NHSO$_2$NH—.

A' represents a single bond or a divalent linking group.

$R_{17}'$ represents —COOH, —COOR$_5$, —CN, a hydroxyl group, an alkoxyl group, —CO—NH—R$_6$, —CO—NH—SO$_2$—R$_6$, or a group having a lactone structure.

$R_6$ represents an alkyl group or a cycloalkyl group.

n represents 0 or 1.

In formulae (pI) to (pV), the alkyl group represented by $R_{12}$ to $R_{25}$ is a straight chain or branched alkyl group having from 1 to 4 carbon atoms, and preferably a methyl group and an ethyl group are exemplified.

The cycloalkyl groups represented by $R_{11}$ to $R_{25}$ or the cycloalkyl group formed by Z and carbon atoms may be monocyclic or polycyclic. Specifically, groups having a monocyclic, bicyclic, tricyclic or tetracyclic structure having 5 or more carbon atoms can be exemplified. The carbon atom number is preferably from 6 to 30, and especially preferably from 7 to 25. These cycloalkyl groups may have a substituent.

As preferred cycloalkyl groups, an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group, and a cyclododecanyl group can be exemplified. More preferred cycloalkyl groups are an adamantyl group, a norbornyl group, a cyclohexyl group, a cyclopentyl group, tetracyclododecanyl group, and a tricyclodecanyl group.

As further substituents of these alkyl and cycloalkyl groups, an alkyl group (having from 1 to 4 carbon atoms), a halogen atom, a hydroxyl group, an alkoxyl group (having from 1 to 4 carbon atoms), a carboxyl group, and an alkoxycarbonyl group (having from 2 to 6 carbon atoms) are exemplified. As the substituents that these alkyl group, alkoxyl group and alkoxycarbonyl group may further have, e.g., a hydroxyl group, a halogen atom and an alkoxyl group can be exemplified.

It is preferred to use the structures represented by formulae (pI) to (pV) in the resin for the protection of alkali-soluble groups. As the alkali-soluble groups, various groups well known in this technical field can be exemplified.

Specifically, structures obtained by substituting the hydrogen atoms of a carboxylic acid group, a sulfonic acid group, a phenol group and a thiol group with any of a structure represented by formulae (pI) to (pV) are exemplified, and preferably structures obtained by substituting the hydrogen atoms of a carboxylic acid group and a sulfonic acid group with any of a structure represented by formulae (pI) to (pV), which form acid-decomposable groups that are decomposed by the action of an acid to become hydrophilic groups.

As the repeating unit having an alkali-soluble group protected with a structure represented by any of formulae (pI) to (pV), a repeating unit represented by the following formula (pA) is preferred.

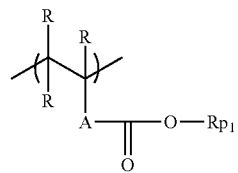

(PA)

In formula (pA), R represents a hydrogen atom, a halogen atom, or a straight chain or branched alkyl group having from 1 to 4 carbon atoms, and a plurality of R's may be the same or different.

A represents a single bond, or a single group or a combination of two or more groups selected from the group consisting of an alkylene group, an ether group, a thioether group, a carbonyl group, an ester group, an amido group, a sulfonamido group, a urethane group, and a urea group.

$Rp_1$ is a group represented by any of formulae (pI) to (pV).

The repeating unit represented by formula (pA) is preferably an acid-decomposable repeating unit having an adamantane structure, and most preferably a repeating unit by 2-alkyl-2-adamantyl(meth)acrylate or dialkyl(1-adamantyl)-methyl(meth)acrylate, that is, structure 1 or 2 of the specific examples of the repeating units represented by formula (pA) shown below. By containing an acid-decomposable repeating unit having an adamantane structure, a high dry etching resistance, high resolution and good profile can be achieved.

As another preferred embodiment, it is preferred that the repeating unit represented by formula (pA) is an acid-decomposable repeating units represented by formulae (X-1a) or (X-1b). By containing an acid-decomposable repeating unit represented by formulae (X-1a) and/or (X-1b), exposure latitude is improved.

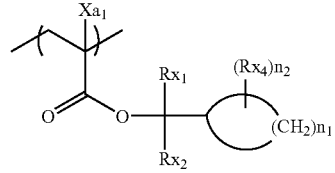

(X-1a)

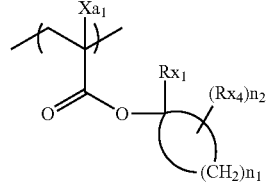

(X-1b)

wherein $Xa_1$ represents a hydrogen atom, an alkyl group, a cyano group or halogen atom; $Rx_1$ and $Rx_2$ each independently represents a straight chain or branched alkyl group, or monocyclic or polycyclic alkyl group; $Rx_4$ represents a straight chain or branched alkyl group or a monocyclic alkyl group; $n_1$ represents an integer of 4 or 5; and $n_2$ represents an integer of from 0 to 3.

In the formulae (X-1a) and (X-1b), $Xa_1$ represents a hydrogen atom, an alkyl group, a cyano group or a halogen atom. The alkyl group in $Xa_1$ may be substituted with a hydroxyl group or a halogen atom. $Xa_1$ is preferably a hydrogen atom or methyl group.

As the straight chain or branched alkyl group in $Rx_1$ and $Rx_2$, an alkyl group having 1 to 4 carbon atoms such as a methyl group, ethyl group, n-propyl group, isopropyl group, n-butyl group, isobutyl group and t-butyl group, is preferred.

As the monocyclic or polycyclic alkyl group in $Rx_1$ and $Rx_2$, a monocyclic alkyl group having 3 to 10 carbon atoms such as a cyclopentyl group and cyclohexyl group, and a polycyclic alkyl group having 7 to 15 carbon atoms such as norbornyl group, tetracyclodecanyl group, tetracyclododecanyl group and adamantyl group, are preferred.

As the straight chain or branched alkyl group in $Rx_4$, the same specific examples as in the straight chain or branched alkyl group in $Rx_1$ and $Rx_2$, may be exemplified.

As the monocyclic alkyl group in $Rx_4$, the same specific examples as in the monocyclic alkyl group in $Rx_1$ and $Rx_2$, may be exemplified.

As a more preferred embodiment, it is preferred for the resin (A) to contain at least one acid-decomposable repeating unit selected from the group consisting of the acid-decomposable repeating units represented by formulae (X-1a) and (X-1b), and at least one acid-decomposable repeating unit having an adamantane structure, by which high dry etching resistance, high resolution, good profile, and broad exposure latitude are compatible.

The repeating unit represented by formula (pA) is especially preferably a repeating unit by 2-alkyl-2-adamantyl (meth)acrylate or dialkyl(1-adamantyl)methyl(meth)acrylate.

The specific examples of the repeating units represented by formula (pA) are shown below.

(In the formulae, Rx represents H, $CH_3$, $CF_3$, $CH_2OH$ or Rxa, and Rxa represents an alkyl group having from 1 to 4 carbon atoms.)

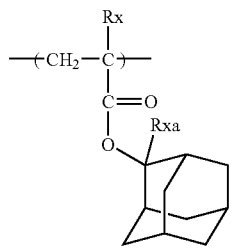

1

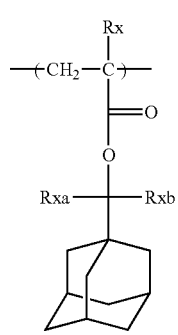

2

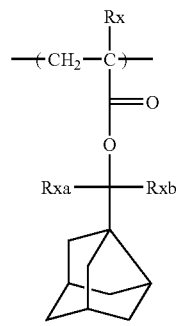

3

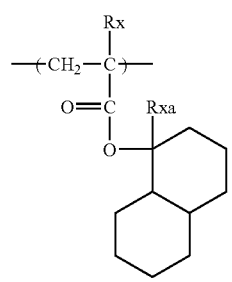

4

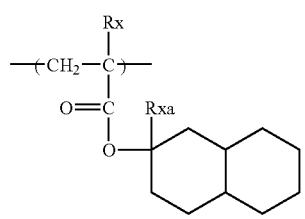

5

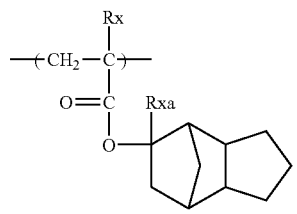

6

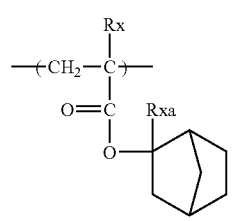

7

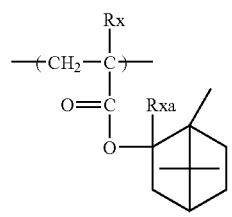

8

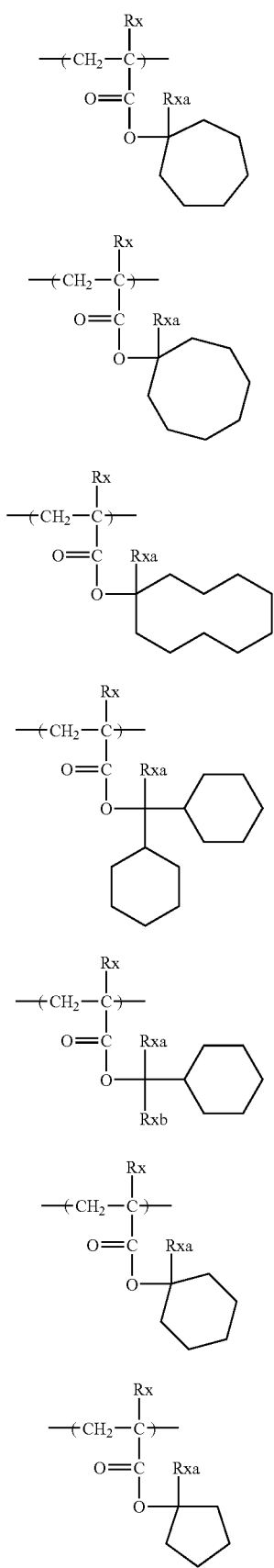
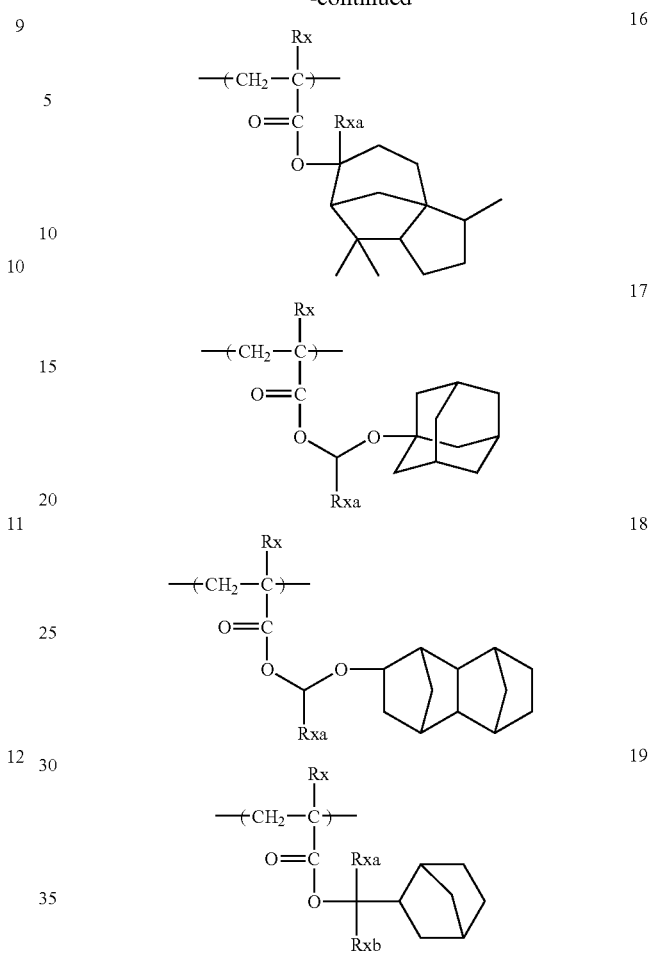

As the halogen atom represented by $R_{11}'$ and $R_{12}'$ in formula (II-AB), a chlorine atom, a bromine atom, a fluorine atom and an iodine atom can be exemplified.

As the alkyl group represented by $R_{11}'$ and $R_{12}'$, a straight chain or branched alkyl group having from 1 to 10 carbon atoms can be exemplified.

The atomic group represented by Z' to form an alicyclic structure is an atomic group to form a repeating unit of alicyclic hydrocarbon, which may have a substituent, in a resin, and an atomic group to form a crosslinking alicyclic structure forming a crosslinking alicyclic hydrocarbon repeating unit is especially preferred.

As the skeleton of the alicyclic hydrocarbon formed, the same alicyclic hydrocarbon groups as those represented by $R_{12}$ to $R_{25}$ in formulae (pI) to (pV) are exemplified.

The skeleton of the alicyclic hydrocarbon may have a substituent, and the groups represented by $R_{13}'$ to $R_{16}'$ in formula (II-AB1) or (II-AB2) can be exemplified as the substituents.

In the acid-decomposable resin, the group capable of decomposing by the action of an acid can contain at least one repeating unit of a repeating unit having a partial structure containing an alicyclic hydrocarbon represented by any of formulae (pI) to (pV), a repeating unit represented by formula (II-AB), and a repeating unit of the later-described copolymer component.

Various substituents of $R_{13}'$ to $R_{16}'$ in formula (II-AB1) or (II-AB2) can also be used as the substituents of the atomic group to form an alicyclic structure in formula (II-AB), or atomic group Z to form a crosslinking alicyclic structure.

The specific examples of the repeating units represented by formula (II-AB1) or (II-AB2) are shown below, but the invention is not restricted to these specific examples.
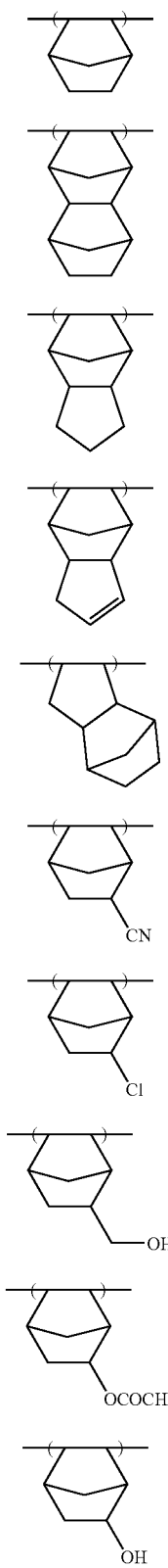
[II-1]
[II-2]
[II-3]
[II-4]
[II-5]
[II-6]
[II-7]
[II-8]
[II-9]
[II-10]
-continued
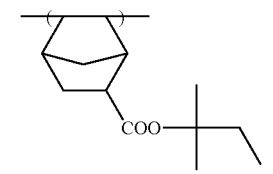
[II-11]
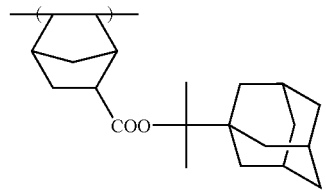
[II-12]
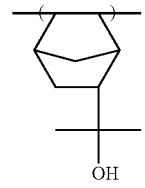
[II-13]
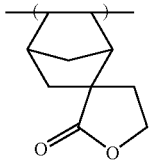
[II-14]
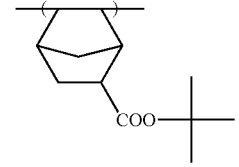
[II-15]
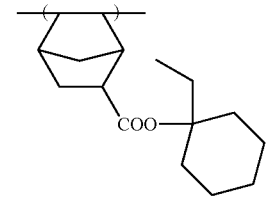
[II-16]
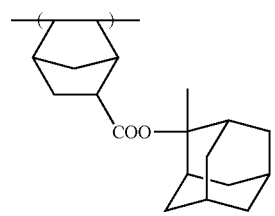
[II-17]
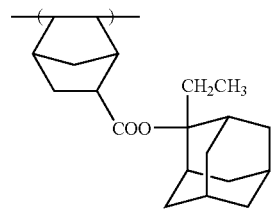
[II-18]

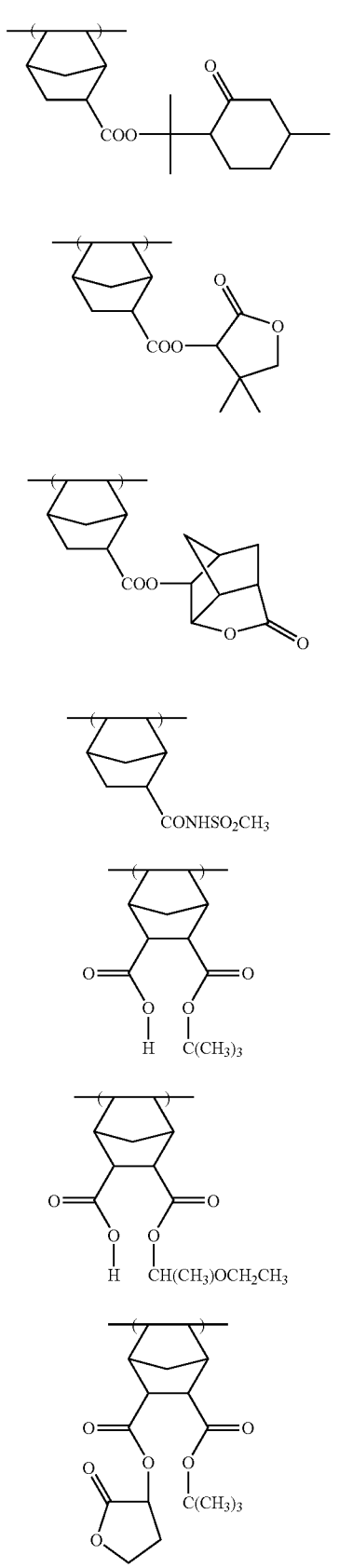

[II-32]

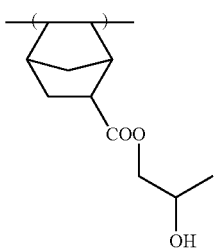

The acid-decomposable resin in the invention may have a repeating unit having a lactone group other than lactone structures represented by formulae (I-1) to (I-4). As the lactone structures other than formulae (I-1) to (I-4), any groups can be used so long as they have a lactone structure, but groups having a 5- to 7-membered lactone structures are preferred, and it is more preferred to have repeating units having a group having a lactone structure represented by any of the following formulae (LC1-1) to (LC1-12). A group having a lactone structure may be directly bonded to a main chain.

LC1-1
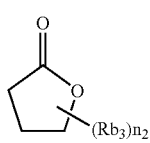

LC1-2
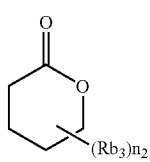

LC1-3
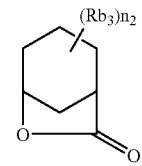

LC1-4
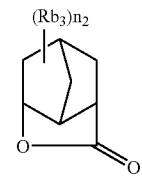

LC1-5
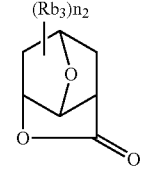

LC1-6
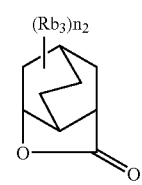

LC1-7
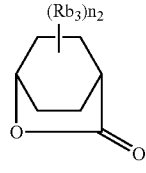

LC1-8
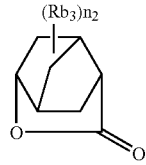

LC1-9
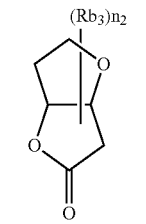

LC1-10
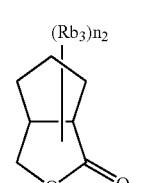

LC1-11
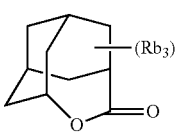

LC1-12

A lactone structure moiety may have a substituent ($Rb_3$). As preferred substituents ($Rb_3$), an alkyl group having from 1 to 8 carbon atoms, a cycloalkyl group having from 4 to 7 carbon atoms, an alkoxyl group having from 1 to 8 carbon atoms, an alkoxycarbonyl group having from 1 to 8 carbon atoms, a carboxyl group, a halogen atom, a hydroxyl group, a cyano group, and an acid-decomposable group are exemplified. $n_2$ represents an integer of from 0 to 4. When $n_2$ represents 2 or more, a plurality of $Rb_3$ may be the same or different, or a plurality of $Rb_3$ may be bonded to each other to form a ring.

As the repeating units having a group having a lactone structure represented by any of the above formulae (LC1-1) to (LC1-12), a repeating unit represented formula (II-AB1) or (II-AB2) in which at least one of $R_{13}'$ to $R_{16}'$ is a group represented by any of formulae (LC1-1) to (LC1-12) (for example, $R_5$ of —$COOR_S$ represents a group represented by any of formulae (LC1-1) to (LC1-12)), and a repeating unit represented by the following formula (AI) can be exemplified.

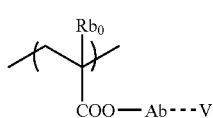

(AI)

In formula (AI), $Rb_0$ represents a hydrogen atom, a halogen atom, or an alkyl group having from 1 to 4 carbon atoms. As preferred substituents that the alkyl group represented by $Rb_0$ may have, a hydroxyl group and a halogen atom are exemplified.

As the halogen atom represented by $Rb_0$, a fluorine atom, a chlorine atom, a bromine atom and an iodine atom can be exemplified. $Rb_0$ preferably represents a hydrogen atom or a methyl group.

Ab represents an alkylene group, a divalent linking group having a monocyclic or polycyclic alicyclic hydrocarbon structure, a single bond, an ether group, an ester group, a carbonyl group, a carboxyl group, or a divalent linking group combining these groups. Ab preferably represents a single bond or a linking group represented by $-Ab_1-CO_2-$.

$Ab_1$ represents a straight chain or branched alkylene group, or a monocyclic or polycyclic cycloalkylene group, and preferably a methylene group, an ethylene group, a cyclohexyl group, an adamantyl group, or a norbornyl group.

V represents a group represented by any of formulae (LC1-1) to (LC1-12).

A repeating unit having a lactone structure is generally present in the form of an optical isomer, and any optical isomers may be used. One kind of optical isomer may be used alone, or a plurality of optical isomers may be used as a mixture. When one kind of optical isomer is primarily used, the optical purity (ee) is preferably 90 or more, and more preferably 95 or more.

The specific examples of repeating units having a group having a lactone structure are shown below, but the invention is not restricted thereto.

(In the formulae, Rx represents H, $CH_3$, $CH_2OH$, or $CF_3$.)

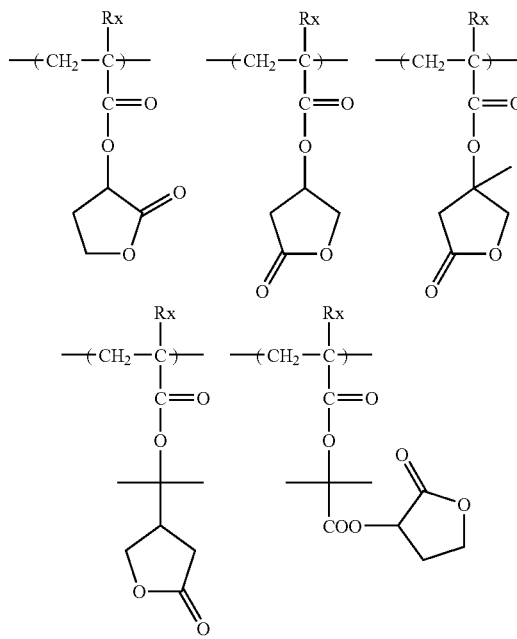

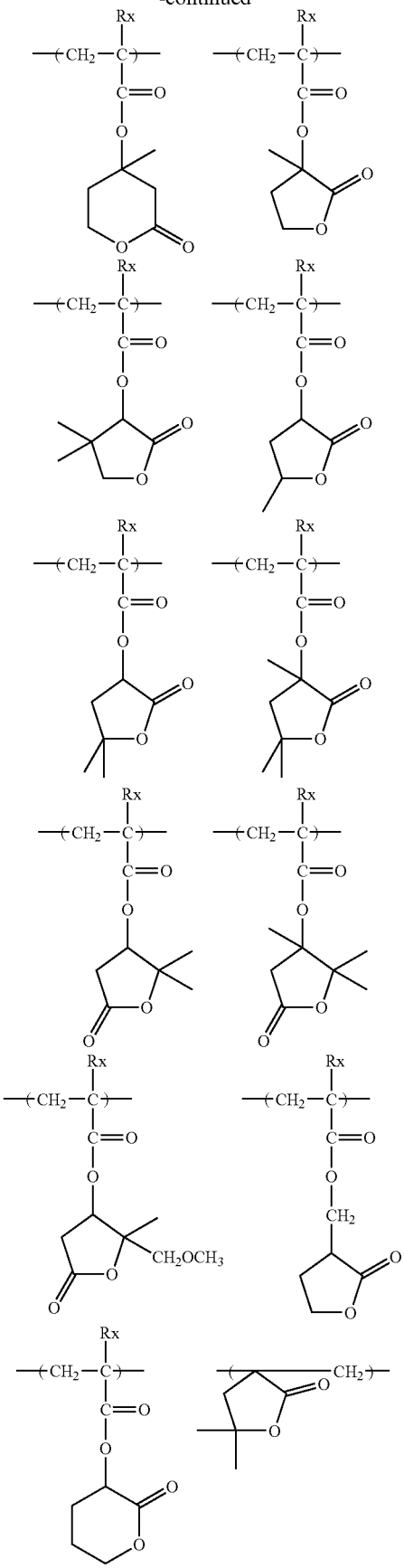

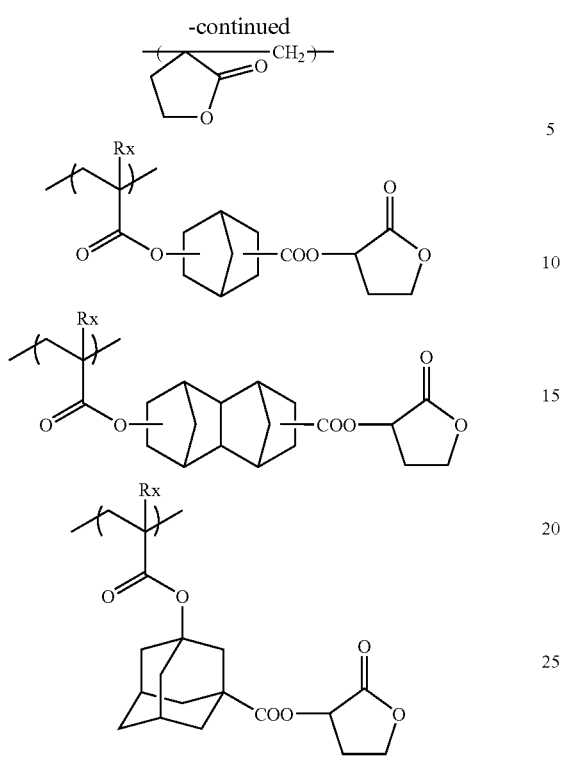
(In the formulae, Rx represents H, CH₃, CH₂OH, or CF₃.)
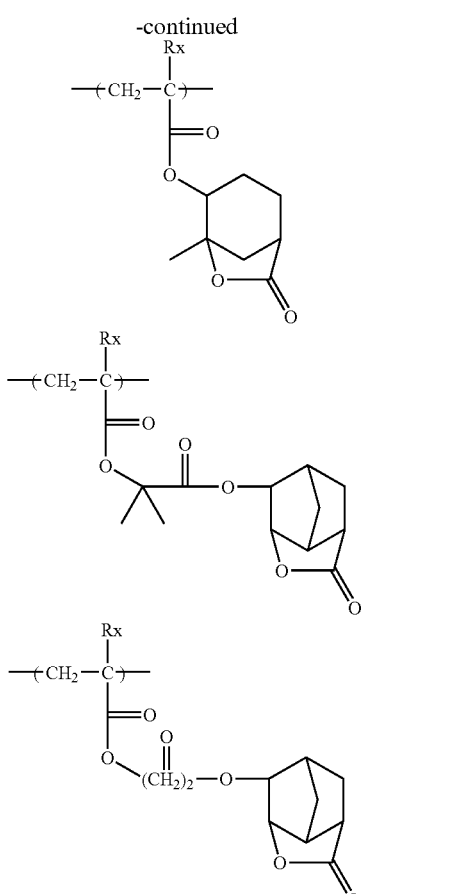
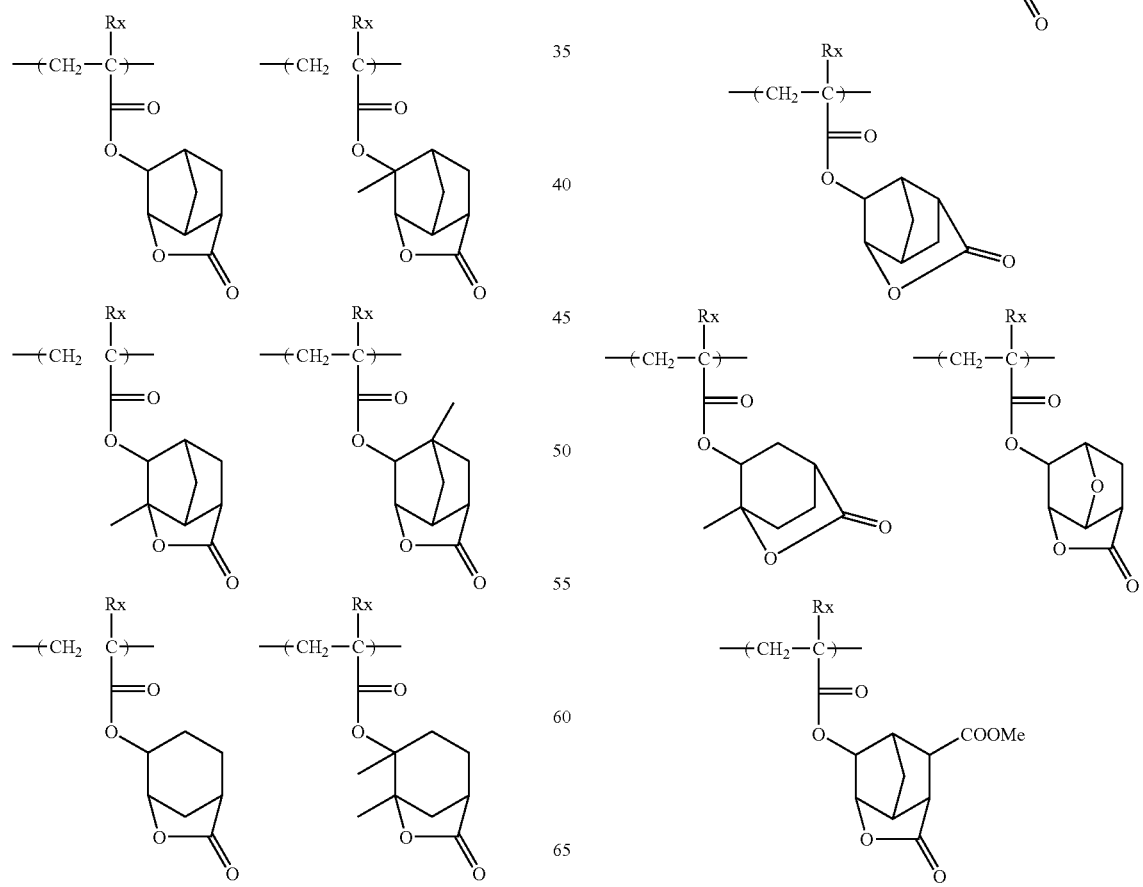

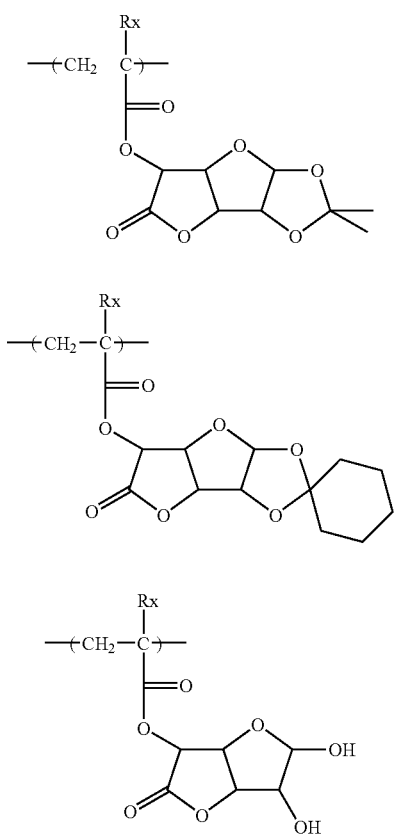

(In the formulae, Rx represents H, CH₃, CH₂OH, or CF₃.)

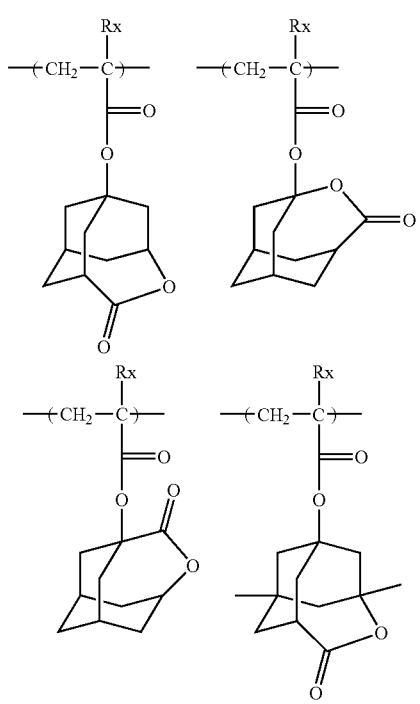

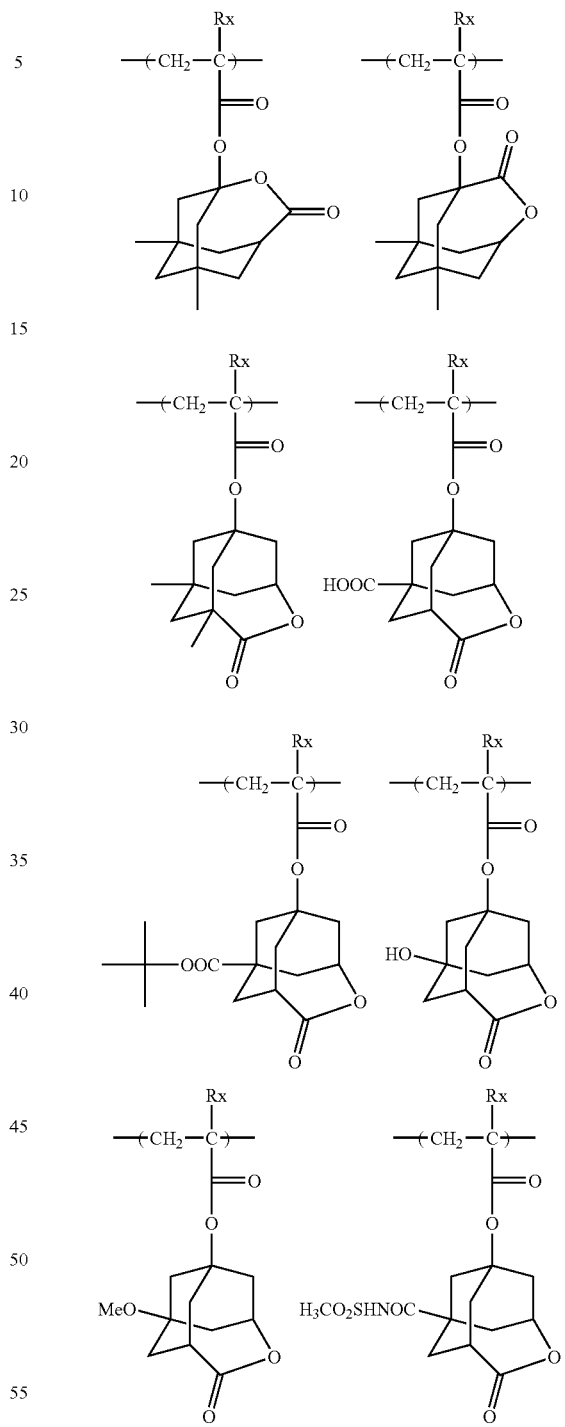

It is preferred for the acid-decomposable resin in the invention to have a repeating unit having an alicyclic hydrocarbon structure substituted with a polar group, by which the adhesion with a substrate and the affinity with a developing solution are improved. As the polar group, a hydroxyl group and a cyano group are preferred. As the alicyclic hydrocarbon structure substituted with a polar group, e.g., a structure represented by the following formula (VIIa) or (VIIb) can be exemplified.

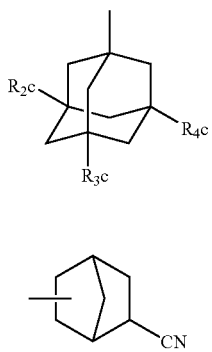

(VIIa)

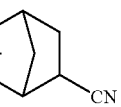

(VIIb)

In formula (VIIa), $R_{2c}$, $R_{3c}$ and $R_{4c}$ each represents a hydrogen atom, a hydroxyl group, or a cyano group, provided that at least one of $R_{2c}$, $R_{3c}$ and $R_{4c}$ represents a hydroxyl group or a cyano group. Preferably one or two of $R_{2c}$, $R_{3c}$ and $R_{4c}$ represent a hydroxyl group, and the remaining represents a hydrogen atom, and more preferably two of $R_{2c}$, $R_{3c}$ and $R_{4c}$ represent a hydroxyl group, and the remaining represents a hydrogen atom.

The group represented by formula (VIIb) is preferably a dihydroxy body or a monohydroxy body, and more preferably a dihydroxy body.

As the repeating unit having a group represented by formula (VIIa) or (VIIb), a repeating unit represented by formula (II-AB1) or (II-AB2) in which at least one of $R_{13}'$ to $R_{16}'$ is a group represented by formula (VII) (for example, $R_5$ of —COOR$_5$ represents a group represented by formula (VII)), or a repeating unit represented by the following formula (AIIa) or (AIIb) can be exemplified.

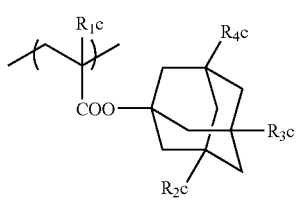

(AIIa)

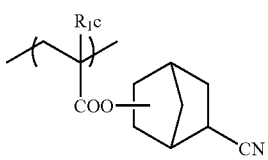

(AIIb)

In formulae (AIIa) and (AIIb), $R_{1c}$ represents a hydrogen atom, a methyl group, a trifluoromethyl group, or a hydroxymethyl group.

The specific examples of the repeating units having a structure represented by formula (AIIa) or (AIIb) are shown below, but the invention is not restricted thereto.

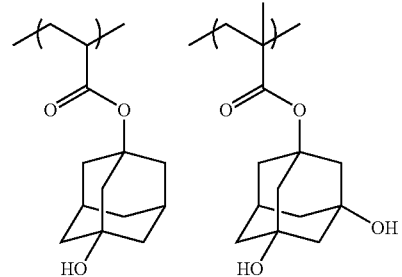

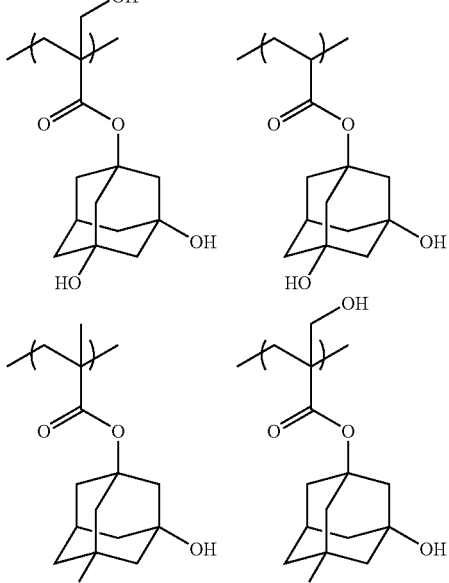

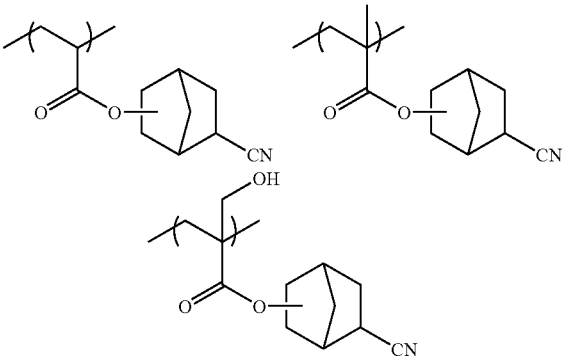

The acid-decomposable resin in the invention may contain a repeating unit represented by the following formula (VIII).

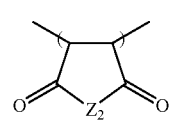

(VIII)

In formula (VIII), $Z_2$ represents —O— or —N(R$_{41}$)—; $R_4$, represents a hydrogen atom, a hydroxyl group, an alkyl group, or —OSO$_2$—R$_{42}$; and R$_{42}$ represents an alkyl group, a cycloalkyl group, or a camphor residue. The alkyl group represented by R$_{41}$ and R$_{42}$ may be substituted with a halogen atom (preferably a fluorine atom), etc.

As the repeating units represented by formula (VIII), the following specific examples are exemplified, but the invention is not limited thereto.

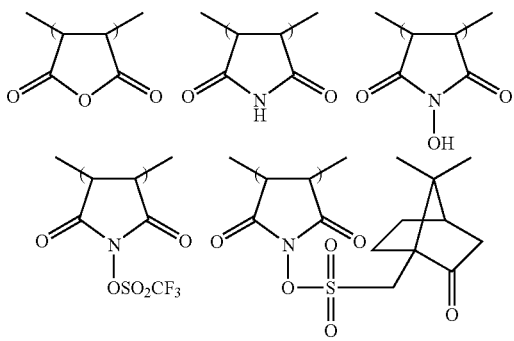

It is preferred for the acid-decomposable resin in the invention to have a repeating unit having an alkali-soluble group, and more preferred to have a repeating unit having a carboxyl group. By containing a repeating unit having a carboxyl group, the resolution for contact hole use is increased. As the repeating unit having a carboxyl group, there are a repeating unit in which the carboxyl group is directly bonded to the main chain of a resin such as a repeating unit by acrylic acid and methacrylic acid, and a repeating unit in which the carboxyl group is bonded to the main chain of a resin through a linking group, and both of these repeating units are preferably used. The linking group may have a monocyclic or polycyclic hydrocarbon structure. Acrylic acrylic acid and methacrylic acid are most preferred.

Further, the acid-decomposable resin in the invention may have a repeating unit having from one to three alkali-soluble groups represented by the following formula (F1), by which line edge roughness properties are improved.

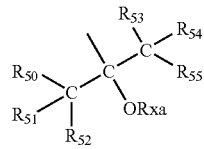

(F1)

In formula (F1), $R_{50}$, $R_{51}$, $R_{52}$, $R_{53}$, $R_{54}$ and $R_{55}$ each represents a hydrogen atom, a fluorine atom, or an alkyl group, provided that at least one of $R_{50}$ to $R_{55}$ represents a fluorine atom, or an alkyl group in which at least one hydrogen atom is substituted with a fluorine atom.

Rx represents a hydrogen atom or an organic group (preferably an acid-decomposable group, an alkyl group, a cycloalkyl group, an acyl group, or an alkoxycarbonyl group).

In formula (F1), the alkyl group represented by $R_{50}$ to $R_{55}$ may be substituted with a halogen atom, e.g., a fluorine atom, or a cyano group, preferably an alkyl group having from 1 to 3 carbon atoms, e.g., a methyl group and a trifluoromethyl group can be exemplified.

It is preferred that all of $R_{50}$ to $R_{55}$ represent a fluorine atom.

As the organic group represented by Rx, an acid-decomposable group, and an alkyl group, a cycloalkyl group, an acyl group, an alkylcarbonyl group, an alkoxycarbonyl group, an alkoxycarbonylmethyl group, an alkoxymethyl group, and a 1-alkoxyethyl group, each of which may have a substituent, are preferred.

The repeating unit represented by formula (F1) is preferably a repeating unit represented by the following formula (F2).

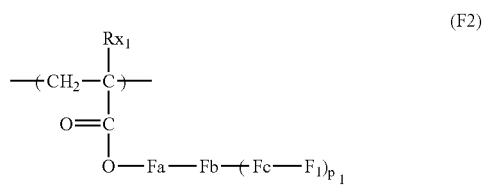

In formula (F2), $Rx_1$ represents a hydrogen atom, a halogen atom, or an alkyl group having from 1 to 4 carbon atoms. As preferred substituents that the alkyl group represented by Rx may have, a hydroxyl group and a halogen atom are exemplified.

Fa represents a single bond, or a straight chain or branched alkylene group, and preferably a single bond.

Fb represents a monocyclic or polycyclic hydrocarbon group.

Fc represents a single bond, or a straight chain or branched alkylene group, and preferably a single bond or a methylene group.

$F_1$ represents a group represented by formula (FP).

$p_1$ represents an integer of from 1 to 3.

The cyclic hydrocarbon group represented by Fb is preferably a cyclopentyl group, a cyclohexyl group, or a norbornyl group.

The specific examples of the repeating units having the structure represented by formula (F1) are shown below.

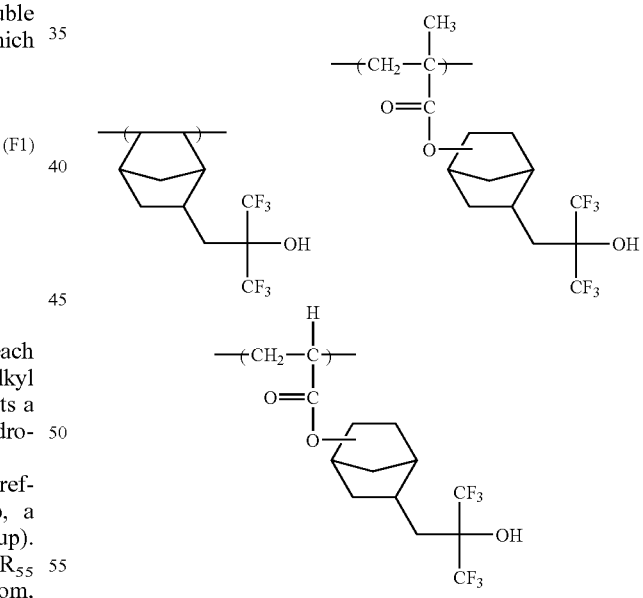

The acid-decomposable resin in the invention may contain various repeating structural units besides the above repeating units for the purpose of adjusting dry etching resistance, an aptitude for standard developing solutions, adhesion to substrates, resist profile, and in addition to these, general requisite characteristics of resists, e.g., resolution, heat resistance and sensitivity.

As these repeating structural units, the repeating structural units corresponding to the monomers shown below can be exemplified, but the invention is not restricted thereto.

By containing various kinds of repeating structural units, fine adjustment of performances required of the acid-decomposable resin, in particular fine adjustment of the following performances becomes possible, that is,
(1) Solubility in a coating solvent,
(2) A film-forming property (a glass transition point),
(3) Alkali developability,
(4) Decrease of layer thickness (hydrophobic-hydrophilic property, the selection of an alkali-soluble group),
(5) Adhesion of an unexposed area to a substrate, and
(6) Dry etching resistance.

The examples of such monomers include compounds having one addition polymerizable unsaturated bond selected from acrylic acid esters, methacrylic acid esters, acrylamides, methacrylamides, allyl compounds, vinyl ethers and vinyl esters.

In addition to the aforementioned compounds, addition polymerizable unsaturated compounds copolymerizable with the monomers corresponding to the above various repeating structural units may be used for copolymerization.

In the acid-decomposable resin, the molar ratio of the content of each repeating structural unit is arbitrarily selected to adjust dry etching resistance and an aptitude for a standard developing solution of the resist, adhesion to a substrate, and resist profile, in addition to these, to adjust general requisite characteristics of resists, e.g., resolution, heat resistance and sensitivity.

The preferred embodiments of the acid-decomposable resin containing the repeating unit having a lactone structure represented by the formulae (I-1) to (I-4) in the invention include the following.
(1) Resins having a repeating unit having a partial structure containing the alicyclic hydrocarbon represented by any of formulae (pI) to (pV) (a side chain type), preferably those having a (meth)acrylate repeating unit having a structure represented by any of formulae (pI) to (pV).
(2) Resins having a repeating unit represented by formula (II-AB) (a main chain type), and the following embodiment is further exemplified in (2).
(3) Resins having a repeating unit represented by formula (II-AB), a maleic anhydride derivative and a (meth)acrylate structure (a hybrid type).

The content of a repeating unit having an acid-decomposable group in the acid-decomposable resin is preferably from 10 to 60 mol % in all the repeating structural units, more preferably from 20 to 50 mol %, and still more preferably from 25 to 40 mol %.

The content of a repeating unit having a lactone structure represented by the formulae (I-1) to (I-4) in the acid-decomposable resin is preferably from 20 to 60 mol % in all the repeating structural units, more preferably from 25 to 55 mol %, and still more preferably from 30 to 50 mol %.

The content of a repeating unit having a partial structure containing alicyclic hydrocarbon represented by any of formulae (pI) to (pV) in the acid-decomposable resin is preferably from 25 to 70 mol % in all the repeating structural units, more preferably from 35 to 65 mol %, and still more preferably from 40 to 60 mol %.

The content of a repeating unit represented by formula (II-AB) in the acid-decomposable resin is preferably from 10 to 60 mol % in all the repeating structural units, more preferably from 15 to 55 mol %, and still more preferably from 20 to 50 mol %.

The content of repeating structural units in the resin on the basis of the monomers of the further copolymerization components can also be optionally set according to desired resist performances, and the content thereof is generally preferably 99 mol % or less based on the total mol number of a repeating structural unit having a partial structure containing alicyclic hydrocarbon represented by any of formulae (pI) to (pV) and a repeating unit represented by formula (II-AB), more preferably 90 mol % or less, and still more preferably 80 mol % or less.

When the composition in the invention is a composition for ArF exposure, it is preferred that the resin should not contain an aromatic group from the point of the transparency to ArF rays.

It is preferred as the acid-decomposable resin for use in the invention that all of the repeating units are composed of (meth)acrylate repeating units. In this case, any case that all of the repeating units comprise methacrylate, all of the repeating units comprise acrylate, and the repeating units comprise a mixture of methacrylate and acrylate, can be used, but it is preferred that acrylate repeating units are 50 mol % or less in all the repeating units. It is more preferred that the acid-decomposable resin in the invention is a terpolymer comprising from 20 to 50% of a repeating unit having a partial structure containing alicyclic hydrocarbon represented by any of formulae (pI) to (pV), from 25 to 50% of a repeating unit having a lactone structure represented by any of formulae (I-1) to (I-4), and from 5 to 30% of a repeating unit having an alicyclic hydrocarbon structure substituted with a polar group, or a quadripolymer further containing from 5 to 20% of a repeating unit having an alkali-soluble group such as a carboxyl group or a structure represented by formula (F1).

The acid-decomposable resin for use in the invention can be synthesized according to ordinary methods (e.g., radical polymerization). For example, as ordinary methods, batch polymerization of performing polymerization by dissolving a monomer seed and a polymerization initiator in a solvent and heating, and drop polymerization of adding a mixed solution of a monomer seed and a polymerization initiator or separately each solution to a heated solvent over 1 to 10 hours by dropping are exemplified, and drop polymerization is preferred. As reaction solvents, ethers, e.g., tetrahydrofuran, 1,4-dioxane, and diisopropyl ether, ketones, e.g., methyl ethyl ketone and methyl isobutyl ketone, ester solvents, e.g., ethyl acetate, amide solvents, e.g., dimethylformamide and dimethylacetamide, and the later-described solvents that dissolve the composition of the invention, e.g., propylene glycol monomethyl ether acetate, propylene glycol monomethyl ether, and cyclohexanone are exemplified. It is more preferred to use in polymerization the same solvents that are used in the resist composition of the invention, by which the generation of particles during preservation can be prevented. It is preferred that polymerization reaction is carried out under an inert gas atmosphere such as nitrogen or argon. Polymerization is initiated with commercially available radical polymerization initiators (e.g., azo initiators, peroxide and the like). As radical polymerization initiators, azo initiators are preferred, and azo initiators having an ester group, a cyano group or a carboxyl group are preferred. As preferred initiators, azobisisobutyronitrile, azobisdimethylvalero-nitrile, dimethyl 2,2'-azobis(2-methylpropionate) are exemplified. If necessary, the initiator is further added at a time or in parts, and after completion of the reaction, the reaction product is put in a solvent, and a desired polymer is recovered as powder or solid. The reaction concentration is from 5 to 50 mass %, and preferably from 10 to 30 mass %. The reaction temperature is generally from 10 to 150° C., preferably from 30 to 120° C., and more preferably from 50 to 110° C.

The weight average molecular weight of the acid-decomposable resin is preferably from 2,000 to 200,000 in polystyrene equivalent by the GPC method. By bringing the weight average molecular weight to 2,000 or more, heat resistance and dry etching resistance can be improved. When the weight average molecular weight is 200,000 or less, developing property can be increased and film-forming property can be improved for low viscosity. The molecular weight is more preferably from 5,000 to 50,000, and still more preferably from 7,000 to 30,000. By adjusting the molecular weight, the heat resistance, resolution, and development defects of the composition can be compatible. The degree of dispersion (Mw/Mn) of the acid-decomposable resin is preferably from 1.0 to 3.0, more preferably from 1.2 to 2.5, and still more preferably from 1.2 to 1.8. Line edge roughness performance can be improved by adjusting the degree of dispersion to an arbitrary range.

The blending amount of the acid-decomposable resin in the positive photosensitive composition of the invention is preferably from 40 to 99.99 mass % in all the solids content, more preferably from 50 to 99 mass %, and still more preferably from 80 to 96 mass %.

[2] (B) A compound capable of generating an acid represented by formula (II-1) or (II-2) upon irradiation with an actinic ray or a radiation:

The positive photosensitive composition in the invention contains a compound capable of generating an acid represented by formula (II-1) or (II-2) upon irradiation with an actinic ray or a radiation (hereinafter also referred to as "compound (B)") as an acid generator.

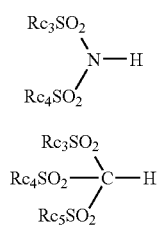

In formulae (II-1) and (II-2), $Rc_3$, $Rc_4$ and $Rc_5$ each represents an organic group, and $Rc_3$ and $Rc_4$ may be bonded to form a ring.

The organic group represented by $Rc_3$ to $Rc_5$ is preferably an alkyl, group in which the 1-position is substituted with a fluorine atom or a fluoroalkyl group, or a phenyl group substituted with a fluorine atom or a fluoroalkyl group. By containing a fluorine atom or a fluoroalkyl group, the acidity of an acid generated by light irradiation increases and sensitivity is improved. $Rc_3$ to $Rc_5$ is more preferably a perfluoroalkyl group having from 1 to 8 carbon atoms, and still more preferably a perfluoroalkyl group having from 1 to 4 carbon atoms.

The group formed by the bonding of $Rc_3$ and $Rc_4$ is preferably an alkylene group or an arylene group, more preferably a perfluoroalkylene group having from 2 to 4 carbon atoms, and still more preferably a perfluoropropylene group. Acidity increases and sensitivity of the composition is improved by bonding $Rc_3$ and $Rc_4$ to form a ring, as compared with those not forming a ring.

The organic group represented by $Rc_3$ to $Rc_5$ or the ring formed by the bonding of $Rc_3$ and $Rc_4$ may further have a substituent. As further substituents, substituents having an aromatic ring, a cyclic hydrocarbon structure, or a cyclic hydrocarbon structure having a hetero atom are preferred. By the introduction of further substituents, the diffusibility of a generated acid can be controlled, and sensitivity and resolution is well balanced.

The specific examples of the acids represented by formula (II-1) are shown below.

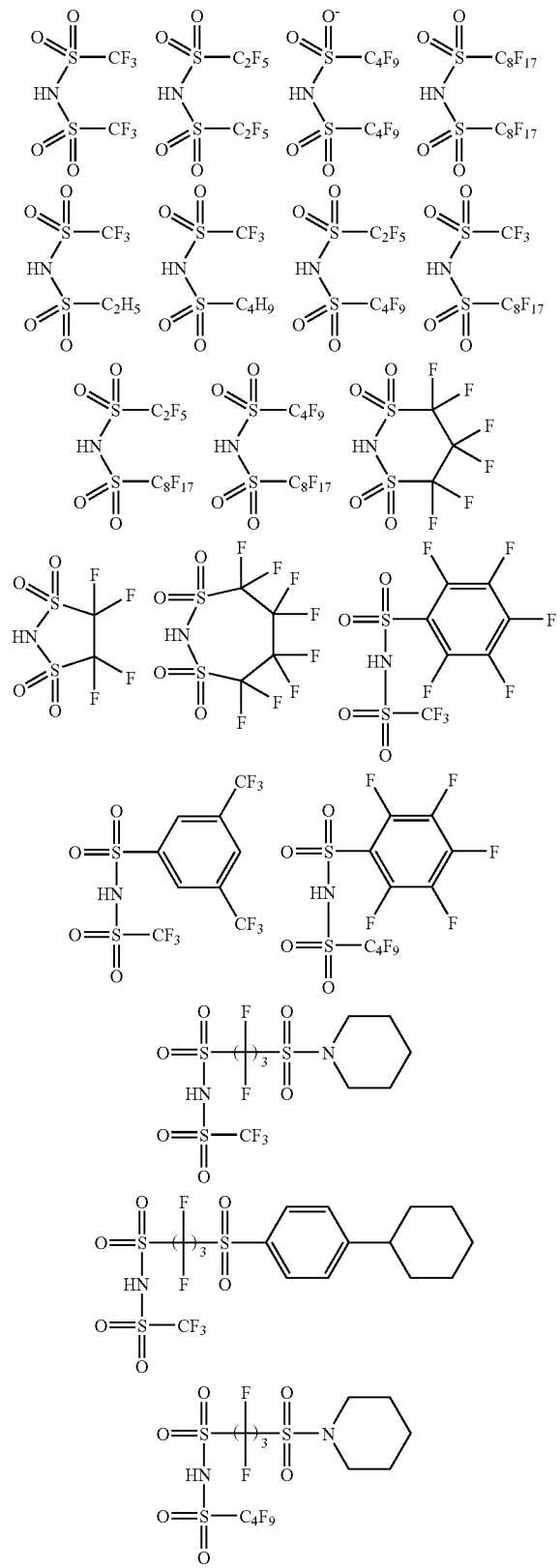

The specific examples of the acids represented by formula (II-2) are shown below.

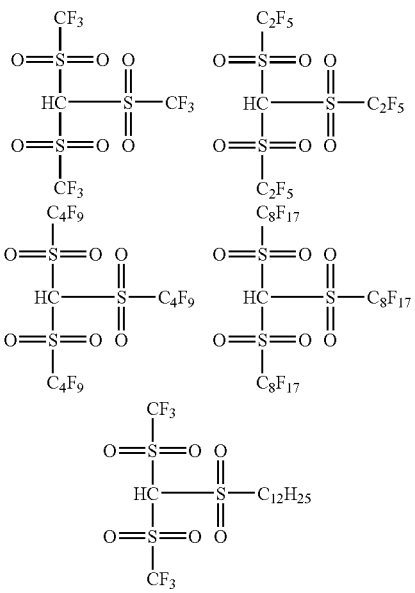

As the compound capable of generating an acid represented by formula (II-1) or (II-2) upon irradiation with an actinic ray or a radiation, a sulfonium salt compound or an iodonium salt compound represented by the following formula (ZI) or (ZII) can be exemplified.

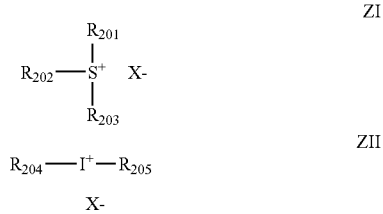

In formula (ZI), $R_{201}$, $R_{202}$ and $R_{203}$ each represents an organic group; and X represents an anion obtained by removing a hydrogen atom from an acid represented by formula (II-1) or (II-2).

The carbon atom number of the organic group represented by $R_{201}$, $R_{202}$ and $R_{203}$ is generally from 1 to 30, and preferably from 1 to 20.

Two of $R_{201}$, $R_{202}$ and $R_{203}$ may be bonded to form a cyclic structure, and an oxygen atom, a sulfur atom, an ester bond, an amido bond or a carbonyl group may be contained in the cyclic structure.

As the group formed by the bonding of two of $R_{201}$, $R_{202}$ and $R_{203}$, an alkylene group (e.g., a butylene group, a pentylene group) can be exemplified.

As the specific examples of the organic groups represented by $R_{201}$, $R_{202}$ and $R_{203}$, corresponding groups in the later-described compounds (ZI-1), (ZI-2) and (ZI-3) can be exemplified.

A compound represented by formula (ZI) may comprise a plurality of structures represented by formula (ZI). For instance, a compound represented by formula (ZI) may be a compound having a structure that at least one of $R_{201}$, $R_{202}$ and $R_{203}$ of a compound represented by formula (ZI) is bonded to at least one of $R_{201}$, $R_{202}$ and $R_{203}$ of another compound represented by formula (ZI).

The following compounds (ZI-1), (ZI-2) and (ZI-3) can be exemplified as more preferred (ZI) components.

A compound represented by formula (ZI) in which at least one of $R_{201}$, $R_{202}$ and $R_{203}$ represents an aryl group, that is, an arylsulfonium compound, is a compound (ZI-1), i.e., a compound having arylsulfonium as a cation.

All of $R_{201}$, $R_{202}$ and $R_{203}$ of the arylsulfonium compound may be aryl groups, or a part of $R_{201}$, $R_{202}$ and $R_{203}$ may be an aryl group and the remainder may be an alkyl group or a cycloalkyl group.

As the arylsulfonium compound, e.g., a triarylsulfonium compound, a diarylalkylsulfonium compound, an aryl-dialkyl-sulfonium compound, a diarylcycloalkylsulfonium compound, and an aryldicycloalkylsulfonium compound are exemplified.

As the aryl group of the arylsulfonium compound, an aryl group, e.g., a phenyl group and a naphthyl group, and a heteroaryl group, e.g., an indole residue and a pyrrole residue are preferred, and a phenyl group and an indole residue are more preferred. When the arylsulfonium compound has two or more aryl groups, these two or more aryl groups may be the same or different.

The alkyl group that the arylsulfonium compound has according to necessity is preferably a straight chain or branched alkyl group having from 1 to 15 carbon atoms, e.g., a methyl group, an ethyl group, a propyl group, an n-butyl group, a sec-butyl group, and a t-butyl group can be exemplified.

The cycloalkyl group that the arylsulfonium compound has according to necessity is preferably a cycloalkyl group having from 3 to 15 carbon atoms, e.g., a cyclopropyl group, a cyclobutyl group and a cyclohexyl group can be exemplified.

The aryl, alkyl and cycloalkyl groups represented by $R_{201}$, $R_{202}$ and $R_{203}$ may have a substituent, e.g., an alkyl group (e.g., having from 1 to 15 carbon atoms), a cycloalkyl group (e.g., having from 3 to 15 carbon atoms), an aryl group (e.g., having from 6 to 14 carbon atoms), an alkoxyl group (e.g., having from 1 to 15 carbon atoms), a halogen atom, a hydroxyl group, and a phenylthio group are exemplified as the substituents. The preferred substituents are a straight chain or branched alkyl group having from 1 to 12 carbon atoms, a cycloalkyl group having from 3 to 12 carbon atoms, and a straight chain or branched alkoxyl group having from 1 to 12 carbon atoms, and the most preferred substituents are an alkyl group having from 1 to 4 carbon atoms and an alkoxyl group having from 1 to 4 carbon atoms. The substituent may be substituted on any one of three of $R_{201}$, $R_{202}$ and $R_{203}$, or may be substituted on all of three. When $R_{201}$, $R_{202}$ and $R_{203}$ each represents an aryl group, it is preferred that the substituent be substituted on the p-position of the aryl group.

In the next place, compound (ZI-2) is described.

Compound (ZI-2) is a compound in the case where $R_{201}$, $R_{202}$ and $R_{203}$ in formula (ZI) each represents an organic group not having an aromatic ring. Here, an aromatic ring having a hetero atom is also included in the aromatic ring.

The organic groups not having an aromatic ring represented by $R_{201}$, $R_{202}$ and $R_{203}$ generally have from 1 to 30, preferably from 1 to 20, carbon atoms.

$R_{201}$, $R_{202}$ and $R_{203}$ each preferably represents an alkyl group, a cycloalkyl group, an allyl group or a vinyl group, more preferably a straight chain, branched or cyclic 2-oxoalkyl group, or an alkoxycarbonylmethyl group, and most preferably a straight chain or branched 2-oxoalkyl group.

The alkyl group represented by $R_{201}$, $R_{202}$ and $R_{203}$ may be straight chain or branched, and is preferably a straight chain or branched alkyl group having from 1 to 10 carbon atoms (e.g., a methyl group, an ethyl group, a propyl group, a butyl group, or a pentyl group), and more preferably a straight chain or branched 2-oxoalkyl group or an alkoxycarbonylmethyl group.

The cycloalkyl group represented by $R_{201}$, $R_{202}$ and $R_{203}$ is preferably a cycloalkyl group having from 3 to 10 carbon atoms (e.g., a cyclopentyl group, a cyclohexyl group or a norbonyl group), and more preferably a cyclic 2-oxoalkyl group.

The 2-oxoalkyl group represented by $R_{201}$, $R_{202}$ and $R_{203}$ may be any of straight chain, branched and cyclic, preferably a group having >C=O at the 2-position of the alkyl group can be exemplified.

As the alkoxyl group in the alkoxycarbonylmethyl group represented by $R_{201}$, $R_{202}$ and $R_{203}$, preferably an alkoxyl group having from 1 to 5 carbon atoms (e.g., a methoxy group, an ethoxy group, a propoxy group, a butoxy group, and a pentoxy group) can be exemplified.

$R_{201}$, $R_{202}$ and $R_{203}$ may further be substituted with a halogen atom, an alkoxyl group (e.g., having from 1 to 5 carbon atoms), a hydroxyl group, a cyano group or a nitro group.

Compound (ZI-3) is a compound represented by the following formula (ZI-3), which compound has a phenacylsulfonium salt structure.

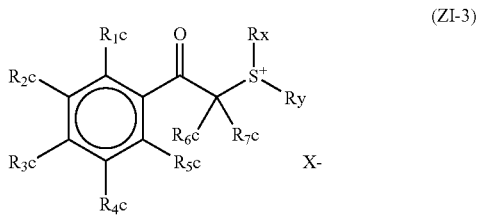

(ZI-3)

In formula (ZI-3), $R_{1c}$, $R_{2c}$, $R_{3c}$, $R_{4c}$ and $R_{5c}$ each represents a hydrogen atom, an alkyl group, a cycloalkyl group, an alkoxyl group or a halogen atom; $R_{6c}$ and $R_{7c}$ each represents a hydrogen atom, an alkyl group or a cycloalkyl group; $R_x$ and $R_y$ each represents an alkyl group, a cycloalkyl group, an allyl group or a vinyl group.

Any two or more of $R_{1c}$ to $R_{5c}$, $R_{6c}$ and $R_{7c}$, and $R_x$ and $R_y$ may be respectively bonded to form a cyclic structure, and an oxygen atom, a sulfur atom, an ester bond or an amido bond may be contained in these rings. As the group formed by the bonding of any two or more of $R_{1c}$ to $R_{5c}$, $R_{6c}$ and $R_{7c}$, and $R_x$ and $R_y$, a butylene group and a pentylene group are exemplified.

The alkyl group represented by $R_{1c}$ to $R_{7c}$ may be either straight chain or branched, e.g., an alkyl grop having from 1 to 20 carbon atoms, preferably a straight chain or branched alkyl group having from 1 to 12 carbon atoms (e.g., a methyl group, an ethyl group, a straight chain or branched propyl group, a straight chain or branched butyl group, and a straight chain or branched pentyl group) can be exemplified.

As the cycloalkyl group represented by $R_{1c}$ to $R_{7c}$, e.g., a cycloalkyl group having from 3 to 20 carbon atoms, preferably a cycloalkyl group having from 3 to 8 carbon atoms (e.g., a cyclopentyl group and a cyclohexyl group) can be exemplified.

The alkoxyl group represented by $R_{1c}$ to $R_{5c}$ may be straight chain, branched or cyclic, e.g., an alkoxyl group having from 1 to 10 carbon atoms, preferably a straight chain or branched alkoxyl group having from 1 to 5 carbon atoms (e.g., a methoxy group, an ethoxy group, a straight chain or branched propoxy group, a straight chain or branched butoxy group, and a straight chain or branched pentoxy group), a cyclic alkoxyl group having from 3 to 8 carbon atoms (e.g., a cyclopentyloxy group and a cyclohexyloxy group) can be exemplified.

Preferably any of $R_{1c}$ to $R_{5c}$ represents a straight chain or branched alkyl group, a cycloalkyl group, or a straight chain, branched or cyclic alkoxyl group, and more preferably the sum total of the carbon atoms of $R_{1c}$ to $R_{5c}$ is from 2 to 15. By selecting such substituents, the solvent solubility is improved and the generation of particles during preservation can be restrained.

As the alkyl group represented by $R_x$ and $R_y$, the same alkyl groups as in $R_{1c}$ to $R_{7c}$ can be exemplified, and a 2-oxoalkyl group and an alkoxymethyl group are more preferred.

As the 2-oxoalkyl group, groups having >C=O at the 2-position of the alkyl group represented by $R_{1c}$ to $R_{5c}$ can be exemplified.

As the alkoxyl groups in the alkoxycarbonylmethyl group, the same alkoxyl groups as $R_{1c}$ to $R_{5c}$ can be exemplified.

As the cycloalkyl group represented by $R_x$ and $R_y$, the same cycloalkyl group represented by $R_{1c}$ to $R_{7c}$ can be exemplified.

$R_x$ and $R_y$ each preferably represents an alkyl group having 4 or more carbon atoms, and more preferably an alkyl group having 6 or more, and still more preferably 8 or more, carbon atoms.

In formula (ZII), $R_{204}$ and $R_{205}$ each represents an aryl group, an alkyl group or a cycloalkyl group.

As the aryl group represented by $R_{204}$ and $R_{205}$, a phenyl group and a naphthyl group are preferred, and a phenyl group is more preferred.

The alkyl group represented by $R_{204}$ and $R_{205}$ may be straight chain or branched, preferably a straight chain or branched alkyl group having from 1 to 10 carbon atoms (e.g., a methyl group, an ethyl group, a propyl group, a butyl group, and a pentyl group) can be exemplified.

The cycloalkyl group represented by $R_{204}$ and $R_{205}$ is preferably a cycloalkyl group having from 3 to 10 carbon atoms (e.g., a cyclopentyl group, a cyclohexyl group and a norbonyl group) can be exemplified.

$R_{204}$ and $R_{205}$ may have a substituent. As the substituents that $R_{204}$ and $R_{205}$ may have, e.g., an alkyl group (e.g., having from 1 to 15 carbon atoms), an aryl group (e.g., having from 6 to 15 carbon atoms), an alkoxyl group (e.g., having from 1 to 15 carbon atoms), a halogen atom, a hydroxyl group and a phenylthio group can be exemplified.

The specific examples of the compounds capable of generating an acid represented by formula (II-1) upon irradiation with an actinic ray or a radiation are shown below.

A2-II-1

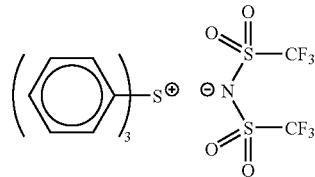

A2-II-2
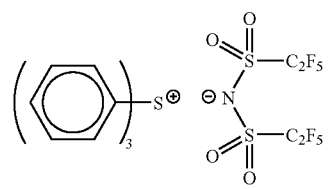
A2-II-3
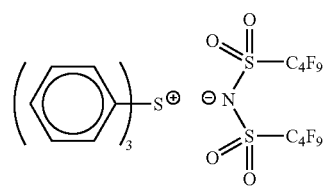
A2-II-4
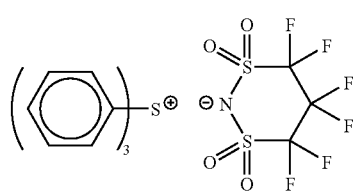
A2-II-5
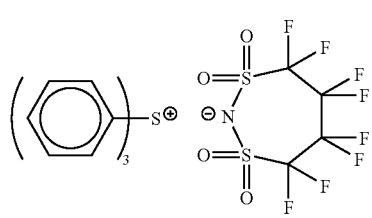
A2-II-6
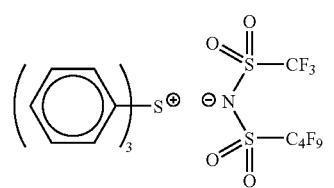
A2-II-7
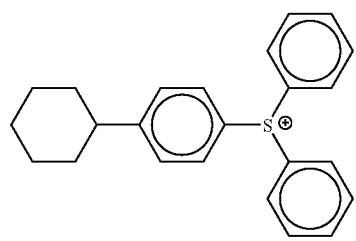
A2-II-8
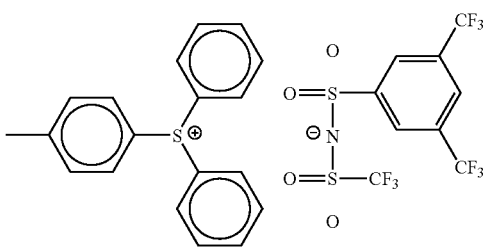
A2-II-9
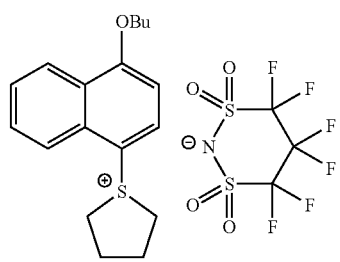
A2-II-10
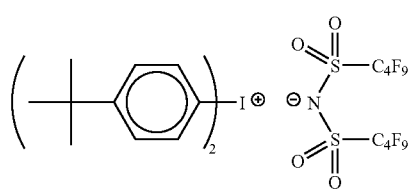
A2-II-11
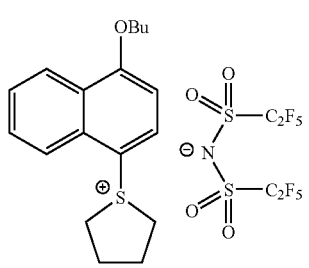
A2-II-12
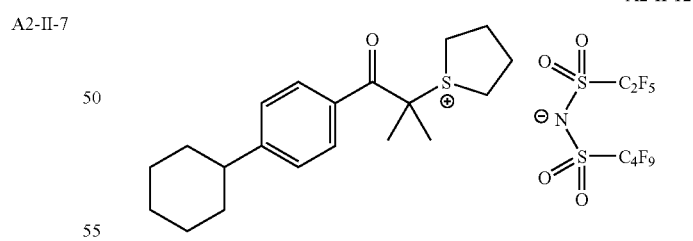
A2-II-13
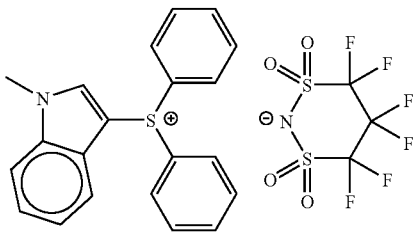

A2-II-14
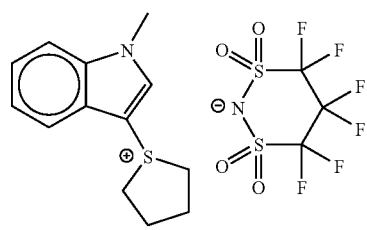

A2-II-15
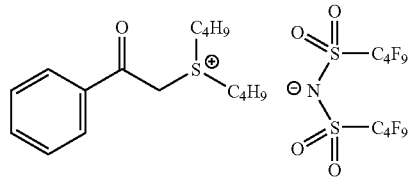

A2-II-16
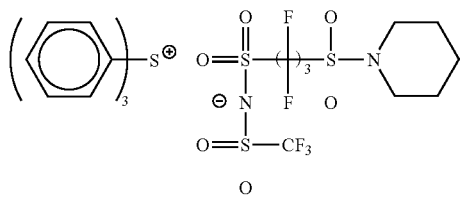

A2-II-17
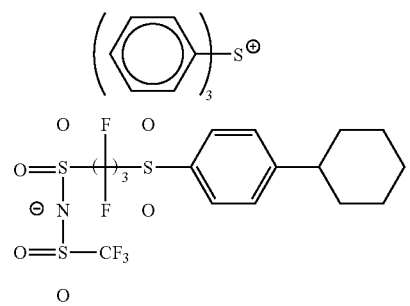

The specific examples of the compounds capable of generating an acid represented by formula (II-2) upon irradiation with an actinic ray or a radiation are shown below.

A2-III-1
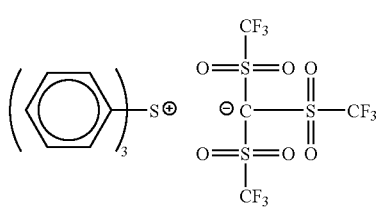

A2-III-2
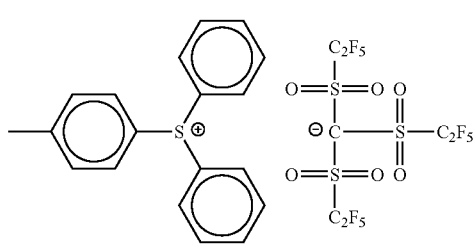

A2-III-3
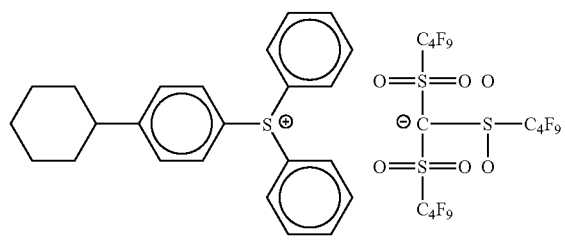

A2-III-4
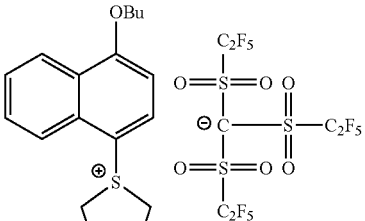

A2-III-5
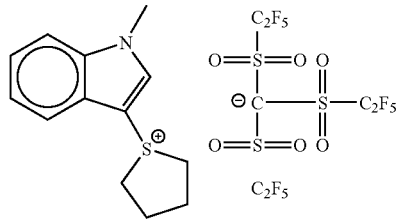

The compound capable of generating an acid represented by formula (II-1) upon irradiation with an actinic ray or a radiation can be synthesized by the reaction of, e.g., a corresponding sulfonium halogen salt and a bissulfonylamide compound or a metallic salt or an ammonium salt thereof, if necessary, in the presence of a silver compound.

The compound capable of generating an acid represented by formula (II-2) upon irradiation with an actinic ray or a radiation can be synthesized by the reaction of, e.g., a corresponding sulfonium halogen salt and a trissulfonyl methide compound or a metallic salt or an ammonium salt thereof, if necessary, in the presence of a silver compound. (A') Acid generator used in combination:

In the invention, besides the above, a compound capable of decomposing upon irradiation with an actinic ray or a radiation to generate an acid (an acid generator) can be used in combination.

As such acid generators usable in combination, photopolymerization initiators of photo-cationic polymerization, photopolymerization initiators of photo-radical polymerization, photo-decoloring agents of dyes, photo-discoloring agents, well-known compounds capable of generating an acid upon irradiation with an actinic ray or a radiation that are used in the process of micro-resist and the like, and the mixtures of these compounds can be optionally used.

Preferred acid generators usable in combination are compounds capable of decomposing upon irradiation with an actinic ray or a radiation to generate a sulfonic acid, more preferably alkanesulfonic acid the α-position of which is substituted with a fluorine atom, preferably a perfluoroalkylsulfonic acid, and a compound substituted with an electron attractive group and capable of generating a benzenesulfonic acid.

As such acid generators, for example, diazonium salt, phosphonium salt, sulfonium salt, iodonium salt, imidosulfonate, oximesulfonate, diazodisulfone, disulfone, and o-nitrobenzyl sulfonate can be exemplified.
As acid generators usable in combination, (z1) to (z43) are shown below.
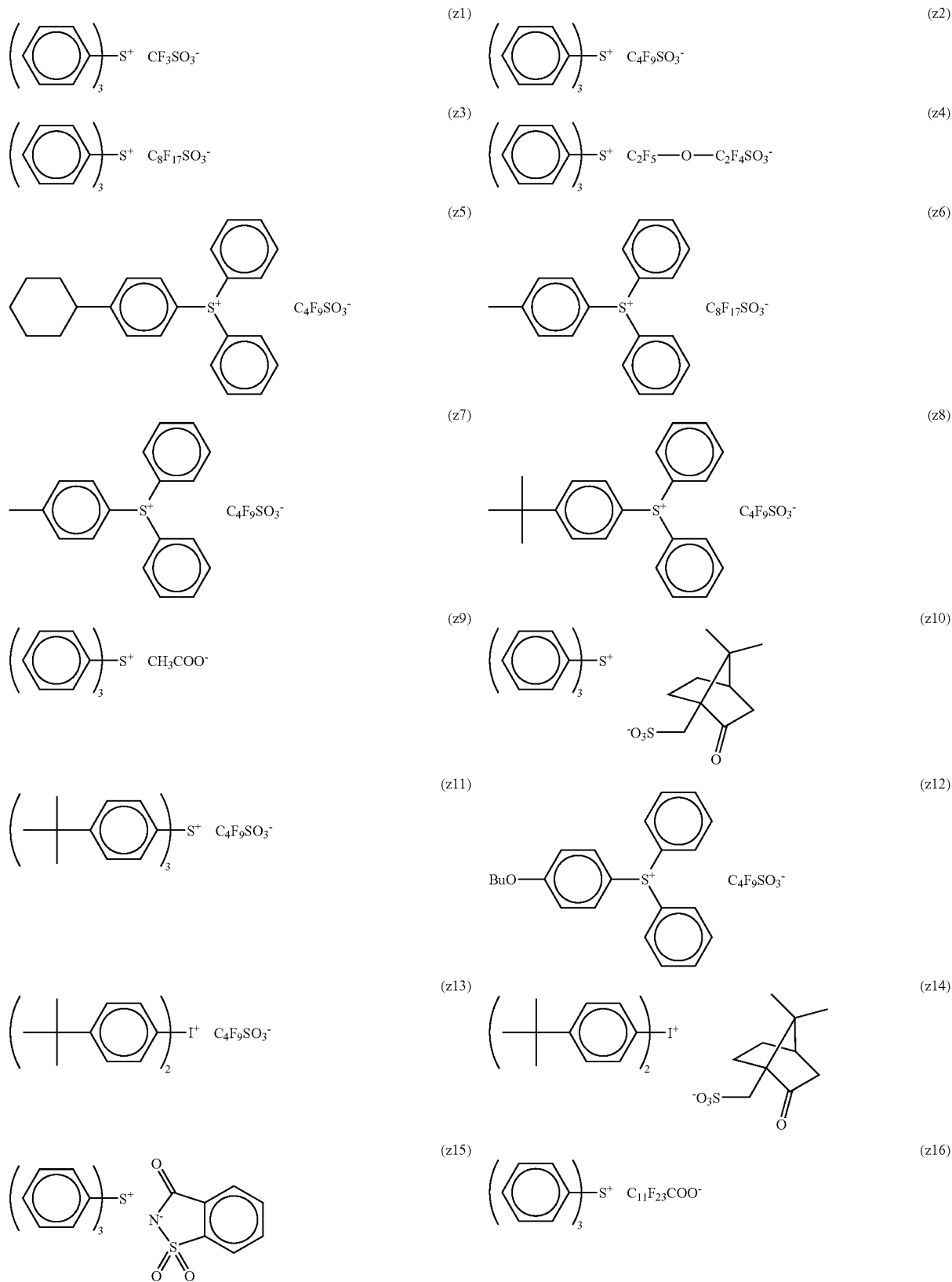

-continued
(z17) 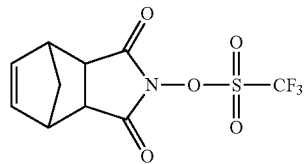
(z18) 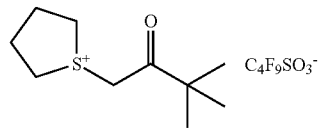
(z19) 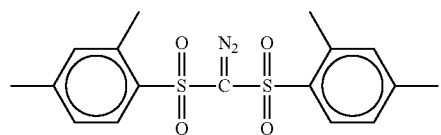
(z20) 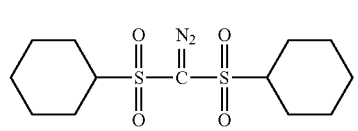
(z21) 
(z22) 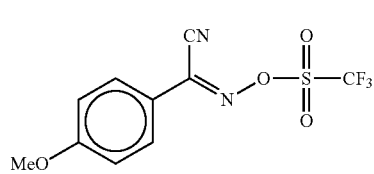
(z23) 
(z24) 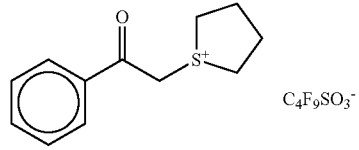
(z25) 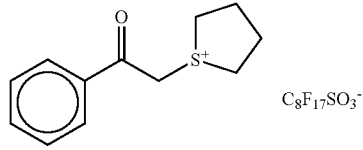
(z26) 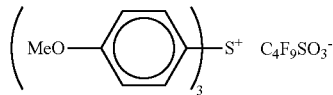
(z27) 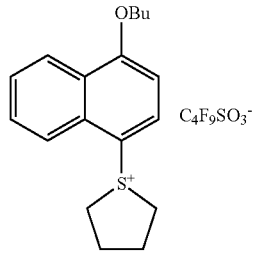
(z28) 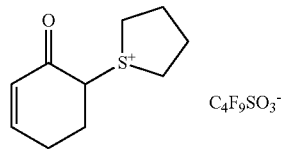
(z29) 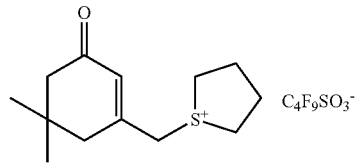
(z30) 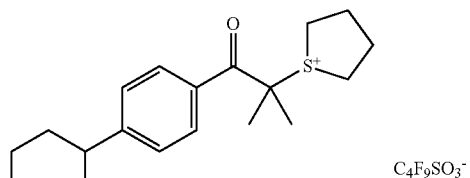
(z31) 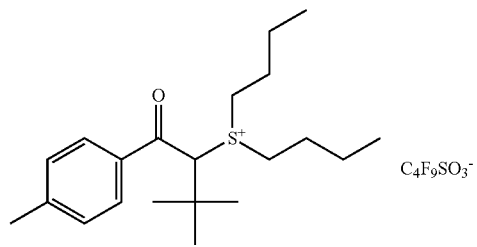

-continued

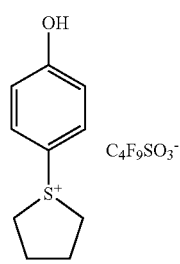 (z32)

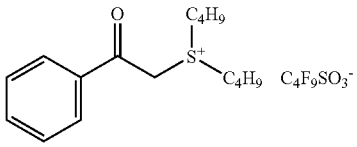 (z33)

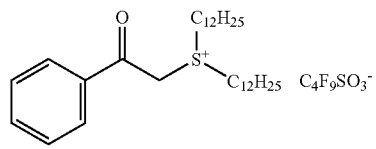 (z34)

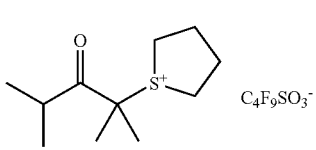 (z35)

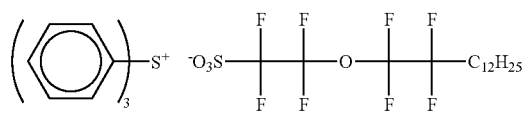 (z36)

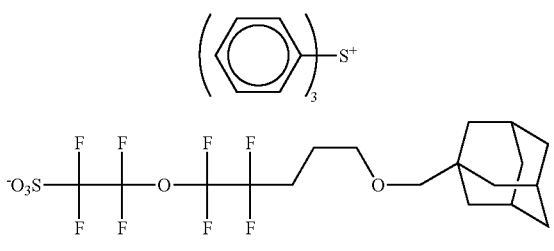 (z37)

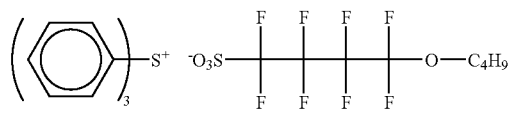 (z38)

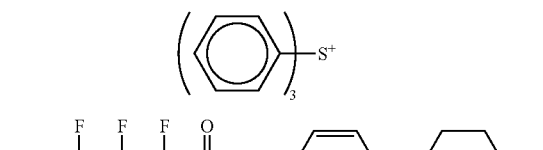 (z39)

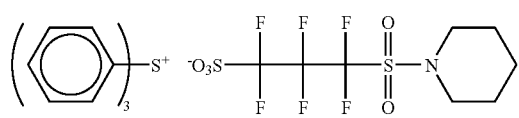 (z40)

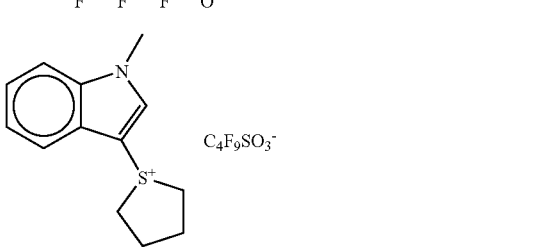 (z41)

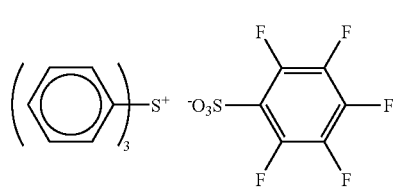 (z42)

 (z43)

The total use amount of acid generators in the positive photosensitive composition of the invention is preferably from 0.5 to 20 mass % to the solids content of the composition, more preferably from 0.5 to 10 mass %, and still more preferably from 1 to 7 mass %. By controlling the addition amount of acid generators, resolution and line edge roughness can be improved while maintaining high sensitivity.

The use amount of the compound (B) in the positive photosensitive composition of the invention is preferably from 0.5 to 10 mass % to the solids content of the composition, more preferably from 2 to 8 mass %, still more preferably from 3 to 7 mass %, particularly preferably from 4 to 6 mass %.

The use amount of the acid generator used in combination in the positive photosensitive composition of the invention is preferably 80 mass % or less to the total use of acid generator in the composition, more preferably from 0 to 60 mass %, and still more preferably from 0 to 40 mass %.

[3] (C) A dissolution inhibiting compound capable of decomposing by the action of an acid to increase the solubility in an alkali developer having a molecular weight of 3,000 or less (hereinafter also referred to as "component (C) or dissolution inhibiting compound"):

As dissolution inhibiting compounds (C) capable of decomposing by the action of an acid to increase the solubility in an alkali developer having a molecular weight of 3,000 or less, not to reduce transmission of 220 nm or less, alicyclic or aliphatic compounds containing an acid-decomposable group, such as the cholic acid derivative containing an acid-decomposable group as described in *Proceeding of SPIE*, 2724, 355 (1996) are preferred. As the acid-decomposable groups and alicyclic structures, the same as those described in the alicyclic hydrocarbon series acid-decomposable resins can be exemplified.

The molecular weight of the dissolution inhibiting compound in the invention is 3,000 or less, preferably from 300 to 3,000, and more preferably from 500 to 2,500.

The addition amount of the dissolution inhibiting compound is preferably from 3 to 50 mass % based on the solids content of the positive photosensitive composition, and more preferably from 5 to 40 mass %.

The specific examples of dissolution inhibiting compounds are shown below, but the invention is not limited thereto.

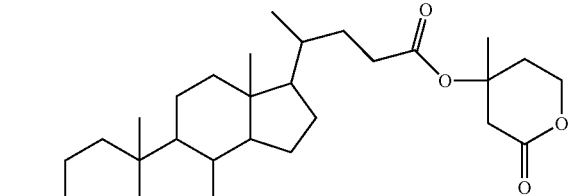
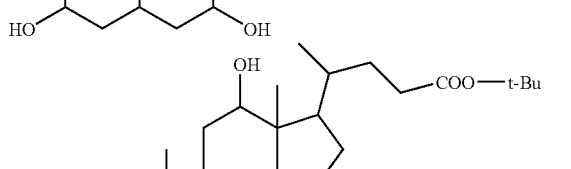
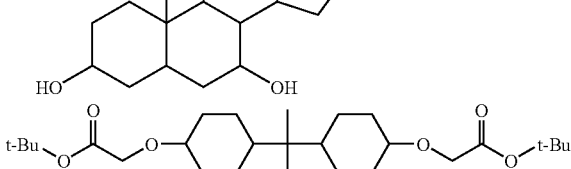
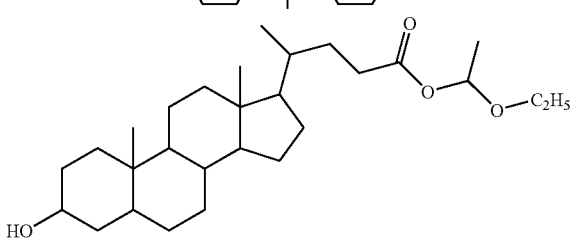
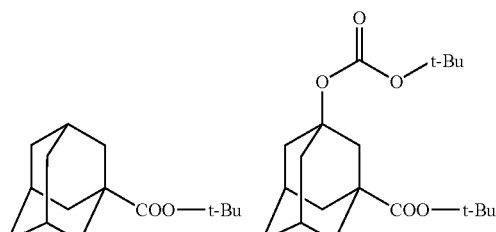
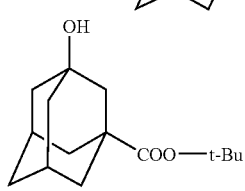

[4] (D) Basic compounds:

For decreasing the fluctuation of performances during the period of time from exposure to baking, it is preferred for the photosensitive composition of the invention to contain (D) basic compounds.

As the preferred structures of basic compounds, the structures represented by the following formulae (A) to (E) can be exemplified.

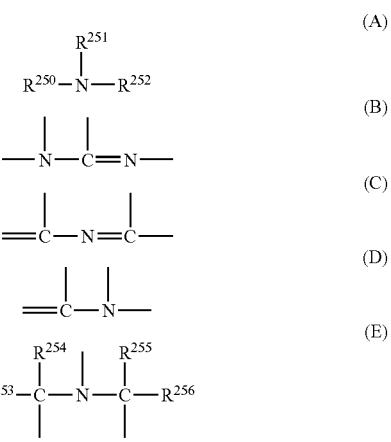

In formula (A), $R_{250}$, $R_{251}$ and $R_{252}$ each represents a hydrogen atom, an alkyl group having from 1 to 20 carbon atoms, a cycloalkyl group having from 3 to 20 carbon atoms, or an aryl group having from 6 to 20 carbon atoms, and $R_{250}$ and $R_{251}$ may be bonded to each other to form a ring. These groups may have a substituent, and as the alkyl group and the cycloalkyl group having a substituent, an aminoalkyl group having from 1 to 20 carbon atoms or an aminocycloalkyl group having from 3 to 20 carbon atoms, a hydroxyalkyl group having from 1 to 20 carbon atoms or a hydroxycycloalkyl group having from 3 to 20 carbon atoms are preferred.

These groups may contain an oxygen atom, a sulfur atom or a nitrogen atom in the alkyl chain.

In formula (E), $R_{253}$, $R_{254}$, $R_{255}$ and $R_{256}$ each represents an alkyl group having from 1 to 6 carbon atoms, or a cycloalkyl group having from 3 to 6 carbon atoms.

As preferred examples of basic compounds, guanidine, aminopyrrolidine, pyrazole, pyrazoline, piperazine, aminomorpholine, aminoalkylmorpholine, and piperidine can be exemplified, and these compounds may have a substituent. As further preferred compounds, compounds having an imidazole structure, a diazabicyclo structure, an onium hydroxide structure, an onium carboxylate structure, a trialkylamine structure, an aniline structure and a pyridine structure, alkylamine derivatives having a hydroxyl group and/or an ether bond, and aniline derivatives having a hydroxyl group and/or an ether bond can be exemplified.

As compounds having an imidazole structure, imidazole, 2,4,5-triphenylimidazole and benzimidazole can be exemplified. As compounds having a diazabicyclo structure, 1,4-diaza-bicyclo[2,2,2]octane, 1,5-diazabicyclo[4,3,0]non-5-ene, and 1,8-diazabicyclo[5,4,0]undeca-7-ene can be exemplified. As compounds having an onium hydroxide structure, triaryl-sulfonium hydroxide, phenacylsulfonium hydroxide, sulfonium hydroxide having a 2-oxoalkyl group, specifically triphenyl-sulfonium hydroxide, tris(t-butylphenyl)sulfonium hydroxide, bis(t-butylphenyl)iodonium hydroxide, phenacylthiophenium hydroxide, and 2-oxopropylthiophenium hydroxide can be exemplified. Compounds having an onium carboxylate structure are compounds having an onium hydroxide structure in which the anionic part is carboxylated, e.g., acetate, adamantane-1-carboxylate and perfluoroalkyl carboxylate are exemplified. As compounds having a trialkylamine structure, tri(n-butyl)-amine and tri(n-octyl)amine can be exemplified. As aniline compounds, 2,6-diisopropylaniline and N,N-dimethylaniline can be exemplified. As alkylamine derivatives having a hydroxyl group and/or an ether bond, ethanolamine, diethanol-amine, triethanolamine and tris(methoxyethoxyethyl)amine can be exemplified. As aniline derivatives having a hydroxyl group and/or an ether bond, N,N-bis(hydroxyethyl)aniline can be exemplified.

These basic compounds are used alone or in combination of two or more. The use amount of basic compounds is generally from 0.001 to 10 mass % based on the solids content of the photosensitive composition, and preferably from 0.01 to 5 mass %. For obtaining a sufficient addition effect, the addition amount is preferably 0.001 mass % or more, and in view of sensitivity and the developability of a non-exposed area, the addition amount is preferably 10 mass % or less.

[5] (E) Fluorine and/or silicon surfactants:

It is preferred for the photosensitive composition in the invention to further contain either one or two or more of fluorine and/or silicon surfactants (a fluorine surfactant and a silicon surfactant, a surfactant containing both a fluorine atom and a silicon atom).

By containing fluorine and/or silicon surfactants, it becomes possible for the photosensitive in the invention to provide a resist pattern excellent in sensitivity and resolution, and low in adhesion defect and development defect in using an exposure light source of 250 nm or lower, in particular, 220 nm or lower.

These fluorine and/or silicon surfactants are disclosed, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720, 5,360,692, 5,529,881, 5,296,330, 5,436,098, 5,576,143, 5,294,511 and 5,824,451. The following commercially available surfactants can also be used as they are.

As commercially available fluorine and silicon surfactants usable in the invention, Eftop EF301 and EF303 (manufactured by Shin-Akita Kasei Co., Ltd.), Fluorad FC 430 and 431 (manufactured by Sumitomo 3M Limited), Megafac F171, F173, F176, F189 and $R_{08}$ (manufactured by Dainippon Ink and Chemicals Inc.), Sarfron S-382, SC101, 102, 103, 104, 105 and 106 (manufactured by ASAHI GLASS CO., LTD.), and Troy Sol S-366 (manufactured by Troy Chemical Co., Ltd.) are exemplified. In addition, polysiloxane polymer KP-341 (manufactured by Shin-Etsu Chemical Co., Ltd.) can also be used as a silicon surfactant.

As surfactants, in addition to the above-shown well known surfactants, surfactants using polymers having fluoro-aliphatic groups derived from fluoro-aliphatic compounds manufactured by a telomerization method (also called a telomer method) or an oligomerization method (also called an oligomer method) can be used. Fluoro-aliphatic compounds can be synthesized according to the method disclosed in JP-A-2002-90991.

As polymers having fluoro-aliphatic groups, copolymers of monomers having fluoro-aliphatic groups and (poly(oxyalkylene))acrylate and/or (poly(oxyalkylene))methacrylate are preferred, and these copolymers may be irregularly distributed or may be block copolymerized. As the poly-(oxy-alkylene) groups, a poly(oxyethylene) group, a poly(oxypropylene) group and poly(oxybutylene) group are exemplified.

Further, the polymers may be units having alkylene different in a chain length in the same chain length, such as a block combination of poly(oxyethylene and oxypropylene and oxyethylene), and a block combination of poly(oxyethylene and oxypropylene). In addition, copolymers of monomers having fluoro-aliphatic groups and poly-(oxyalkylene)acrylate (or methacrylate) may be not only bipolymers but also terpolymers or higher polymers obtained by copolymerization of monomers having different two or more kinds of fluoro-aliphatic groups and different two or more kinds of poly(oxyalkylene)acrylates (or methacrylates) at the same time.

For example, as commercially available surfactants, Megafac F178, F470, F473, F F475, F476 and F472 (manufactured by Dainippon Ink and Chemicals Inc.) can be exemplified. Further, copolymers of acrylate (or methacrylate) having a $C_6F_{13}$ group and (poly(oxyalkylene))acrylate (or methacrylate), copolymers of acrylate (or methacrylate) having a $C_6F_{13}$ group, (poly(oxyethylene))acrylate (or methacrylate), and (poly(oxypropylene)) acrylate (or methacrylate), copolymers of acrylate (or methacrylate) having a $C_8F_{17}$ group and (poly-(oxyalkylene))acrylate (or methacrylate), and copolymers of acrylate (or methacrylate) having a $C_8F_{17}$ group, (poly(oxy-ethylene))acrylate (or methacrylate), and poly(oxypropylene)acrylate (or methacrylate) are exemplified.

The amount of fluorine and/or silicon surfactants is preferably from 0.0001 to 2 mass % to the total amount of the photosensitive composition (excluding solvents), more preferably from 0.001 to 1 mass %.

[6] (F) An organic solvent:

For using the positive photosensitive composition in the invention, the above components are dissolved in a prescribed organic solvent.

As the organic solvents usable in the invention, ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran are exemplified.

In the invention, organic solvents may be used alone or as mixed solvents, but it is preferred to use a mixed solvent containing two or more solvents having different functional groups. As mixed solvents having different functional groups, it is preferred to use a mixed solvent obtained by mixing a solvent having a hydroxyl group in the structure and a solvent not having a hydroxyl group, and a mixed solvent obtained by mixing a solvent having an ester structure and a solvent having a ketone structure, by which the generation of particles during preservation of a resist solution can be reduced.

As solvents having a hydroxyl group, e.g., ethylene glycol, ethylene glycol monomethyl ether, ethylene glycol monoethyl ether, propylene glycol, propylene glycol monomethyl ether, propylene glycol monoethyl ether and ethyl lactate are exemplified. Of these solvents, propylene glycol monomethyl ether and ethyl lactate are particularly preferred.

As solvents not having a hydroxyl group, e.g., propylene glycol monomethyl ether acetate, ethylethoxy propionate, 2-heptanone, γ-butyrolactone, cyclohexanone, butyl acetate, N-methylpyrrolidone, N,N-dimethylacetamide, and dimethyl sulfoxide are exemplified. Of these solvents, propylene glycol monomethyl ether acetate, ethylethoxy propionate, 2-heptanone, γ-butyrolactone, cyclohexanone and butyl acetate are more preferred, and propylene glycol monomethyl ether acetate, ethylethoxy propionate, 2-heptanone and cyclohexanone are especially preferred.

The mixing ratio (by mass) of a solvent having a hydroxyl group and a solvent not having a hydroxyl group is generally from 1/99 to 99/1, preferably from 10/90 to 90/10, and more preferably from 20/80 to 60/40. A mixed solvent containing 50 mass % or more of a solvent not having a hydroxyl group is preferred in the point of coating uniformity.

In a mixed solvent obtained by mixing a solvent having an ester structure and a solvent having a ketone structure, as the solvent having a ketone structure, cyclohexanone and 2-heptanone are exemplified, and preferably cyclohexanone. As the solvent having an ester structure, propylene glycol monomethyl ether acetate, ethylethoxy propionate, γ-butyrolactone, and butyl acetate are exemplified, and preferably propylene glycol monomethyl ether acetate.

The mixing ratio (by mass) of a solvent having an ester structure and a solvent having a ketone structure is generally from 1/99 to 99/1, preferably from 10/90 to 90/10, and more preferably from 20/80 to 60/40. A mixed solvent containing 50 mass % or more of a solvent having an ester structure is especially preferred in the point of coating uniformity.

Other Additives:

If necessary, dyes, plasticizers, surfactants other than the surfactants of component (G), photosensitizers, and compounds for expediting the dissolution of composition in a developer may be further added to the photosensitive composition in the present invention.

Compounds for expediting dissolution in a developer that can be used in the invention are low molecular weight compounds having a molecular weight of 1,000 or less and having two or more phenolic OH groups or one or more carboxyl groups. When carboxyl groups are contained, alicyclic or aliphatic compounds are preferred.

The preferred addition amount of these dissolution accelerating compounds is preferably from 2 to 50 mass % based on the addition amount of the acid decomposable resin, more preferably from 5 to 30 mass %. The amount is preferably 50 mass % or less in the point of restraint of development residue and prevention of pattern deformation in development.

These phenolic compounds having a molecular weight of 1,000 or less can be easily synthesized with referring to the methods disclosed, e.g., in JP-A-4-122938, JP-A-2-28531, U.S. Pat. No. 4,916,210, and EP 219294.

As the specific examples of the alicyclic or aliphatic compounds having carboxyl groups, carboxylic acid derivatives having a steroid structure, e.g., cholic acid, deoxycholic acid, and lithocholic acid, adamantanecarboxylic acid derivatives, adamantanedicarboxylic acid, cyclohexanecarboxylic acid, and cyclohexanedicarboxylic acid are exemplified, but the invention is not limited to these compounds.

Surfactants other than fluorine and/or silicon surfactants of component (E) can be used in the invention. As the specific examples of other surfactants, nonionic surfactants, e.g., polyoxyethylene alkyl ethers, polyoxy-ethylene alkylaryl ethers, polyoxyethylene-polyoxypropylene block copolymers, sorbitan aliphatic acid esters, and polyoxyethylene sorbitan aliphatic acid esters can be exemplified.

These surfactants may be used alone or in combination of two or more.

Pattern Forming Method:

The positive photosensitive composition in the invention is used by dissolving each of the above components in a prescribed organic solvent, preferably dissolving in a mixed solvent as described above, and coating the solution on a prescribed support as follows.

For example, the positive photosensitive composition is coated on a substrate such as the one-used in the manufacture of precision integrated circuit element (e.g., silicon/silicon dioxide coating) by an appropriate coating method with a spinner or a coater, and dried, to thereby form a photosensitive film.

The photosensitive film is then irradiated with an actinic ray or radiation through a prescribed mask, the exposed photosensitive film is preferably subjected to baking (heating) and development, whereby a good pattern can be obtained.

At the time of irradiation with an actinic ray or a radiation, exposure (immersion exposure) may be carried out by filling a liquid (immersion medium) having a higher refractive index than that of air between a photosensitive film and a lens, by which resolution can be heightened. As the immersion medium used, any type of the immersion medium can be used as far as it has a higher refractive index than that of air, but preferably a purified water. An overcoat layer may be further provided on a photosensitive film so as not to directly contact the immersion medium with the photosensitive layer at an immersion exposure, whereby an elution of the composition from the photosensitive film to the immersion medium is inhibited and a development defect reduces.

As actinic rays or radiation, infrared rays, visible rays, ultraviolet rays, far ultraviolet rays, X-rays and electron beams can be exemplified, preferably far ultraviolet rays of the wavelengths of 250 nm or less, and more preferably 220 nm or less. Specifically, a KrF excimer laser (248 nm), an ArF excimer laser (193 nm), an $F_2$ excimer laser (157 nm), X-rays and electron beams are exemplified, and ArF excimer lasers, $F_2$ excimer lasers, EUV (13 nm), and electron beams are preferably used.

In a development process, an alkali developer is used as follows. As the alkali developer of the resist composition, alkaline aqueous solutions of inorganic alkalis, e.g., sodium hydroxide, potassium hydroxide, sodium carbonate, sodium silicate, sodium metasilicate and aqueous ammonia, primary amines, e.g., ethylamine and n-propylamine, secondary amines, e.g., diethylamine and di-n-butylamine, tertiary amines, e.g., triethylamine and methyldiethylamine, alcohol amines, e.g., dimethylethanolamine and triethanol-amine, quaternary ammonium salts, e.g., tetramethylammonium hydroxide and tetraethylammonium hydroxide, and cyclic amines, e.g., pyrrole and piperidine, can be used.

An appropriate amount of alcohols and surfactants may be added to these alkali developers.

The alkali concentration of alkali developers is generally from 0.1 to 20 mass %.

The pH of alkali developers is generally from 10.0 to 15.0.

EXAMPLE

The invention will be described in more detail with reference to Examples, but the invention is not limited thereto.

Synthesis Example 1

Synthesis of Compound (A2-II-1)

Triphenylsulfonium iodide (3.3 g) was dissolved in acetonitrile/distilled water (2/1), 1.5 g of silver acetate was added to the above solution, and the solution was stirred for 30 minutes. A precipitated silver compound was filtered, and 2.55 g of bis(trifluoromethanesulfonyl)imide lithium salt mixed in acetonitrile/distilled water (2/1) was added to the filtrate. The reaction solution was concentrated, and then dissolved in 200 ml of chloroform. The resulted solution was washed with distilled water, an aqueous solution of ammonium chloride, and water. The organic phase was filtered through a polytetrafluoroethylene filter having a pore diameter of 0.1 μm and the filtrate was concentrated, whereby 3.4 g of compound (A2-II-1) was obtained.

Synthesis Example 2

Synthesis of Compound (A2-II-4)

Triphenylsulfonium iodide (3.3 g) was dissolved in acetonitrile/distilled water (2/1), 1.5 g of silver acetate was added to the above solution, and the solution was stirred for 30 minutes. A precipitated silver compound was filtered, and 2.94 g of a compound represented by formula (IA) shown below dissolved in acetonitrile/distilled water (2/1) was added to the filtrate. The reaction solution was concentrated, and then dissolved in 200 ml of chloroform. The resulted solution was washed with distilled water, an aqueous solution of ammonium chloride, and water. The organic phase was filtered through a polytetrafluoroethylene filter having a pore diameter of 0.1 μm and the filtrate was concentrated, whereby 4.2 g of compound (A2-II-4) was obtained.

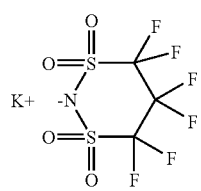

(IA)

Synthesis Example 3

Synthesis of Resin (RA-1)

Under nitrogen current, 5.7 g of propylene glycol monomethyl ether acetate and 3.82 g of propylene glycol monomethyl ether were put in a three-neck flask and heated at 80° C. Monomer (1) (9.5 g) shown below, 4.7 g of hydroxy-adamantane methacrylate, 9.5 g of 2-methyl-2-adamantyl methacrylate, and 6 mol % to the monomer of a polymerization initiator V-601 (a product of Wako Pure Chemical Industries) were dissolved in a mixed solvent comprising 51.2 g of propylene glycol monomethyl ether acetate/34.1 g of propylene glycol monomethyl ether, and the solution obtained was dripped into the flask over 6 hours. After completion of dripping, the reaction solution was further allowed to react at 80° C. for 2 hours. After being cooled, the reaction solution was poured into 900 ml of hexane/100 ml of ethyl acetate, and the precipitated powder was filtered and dried, whereby 19 g of resin (RA-1) was obtained.

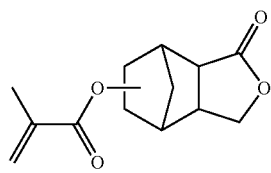

Monomer (1)

Mixture of Isomers Different in Bonding Position of a Methacryloyloxy Group

Resins (RA-2) to (RA-18) and resin (Q1) used in comparative examples were synthesized according to the same drop polymerization method.

The structures of resins (RA-1) to (RA-18) and resin (Q1) are shown below.

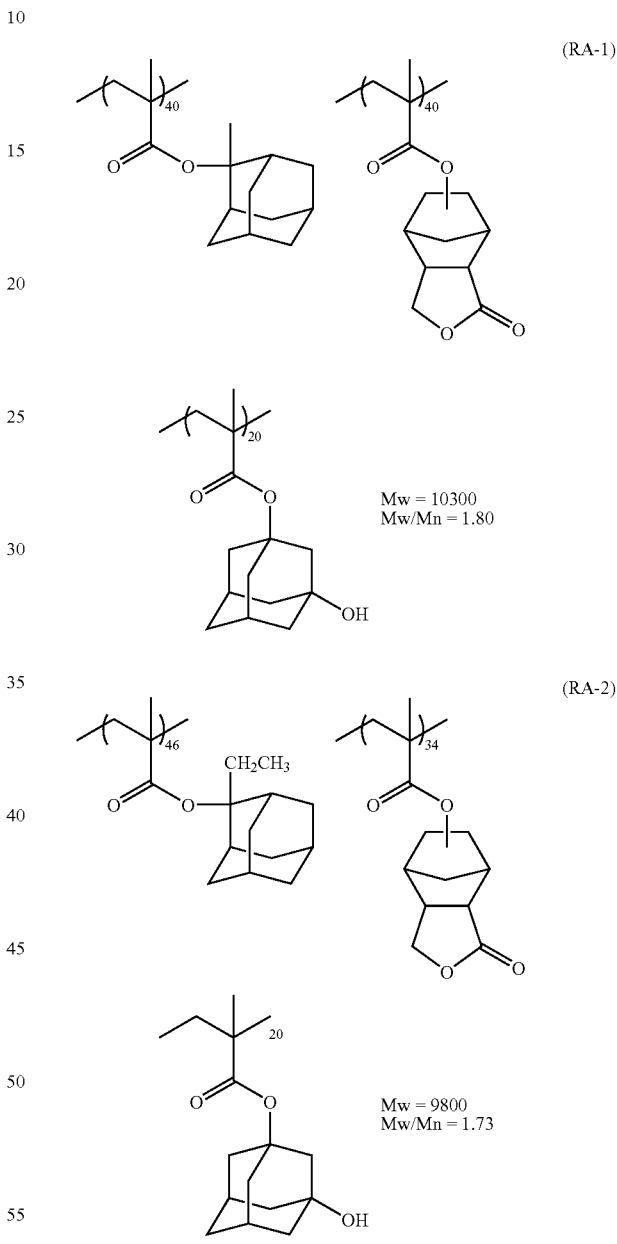

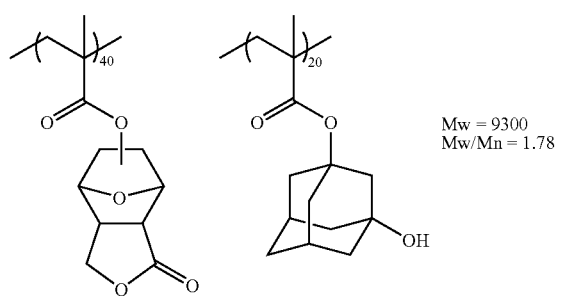
Mw = 9300
Mw/Mn = 1.78
(RA-6)
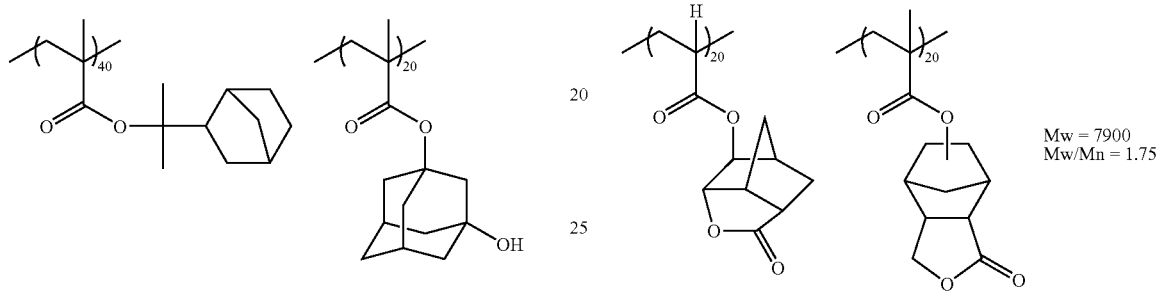
Mw = 7900
Mw/Mn = 1.75
(RA-4)
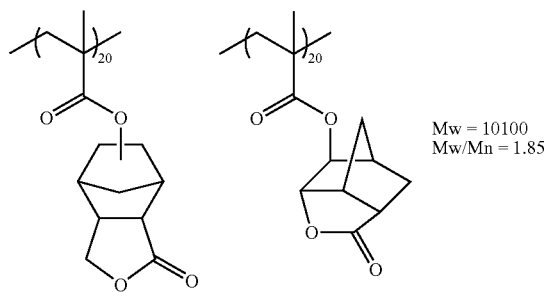
Mw = 10100
Mw/Mn = 1.85
(RA-7)
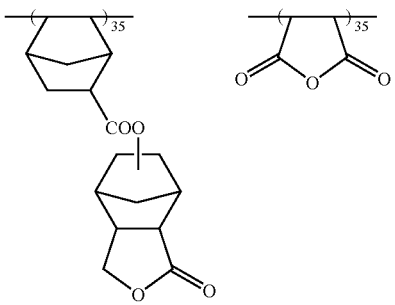
(RA-5)
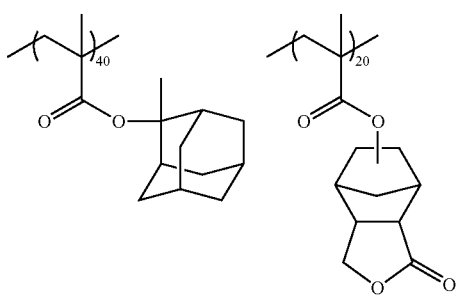
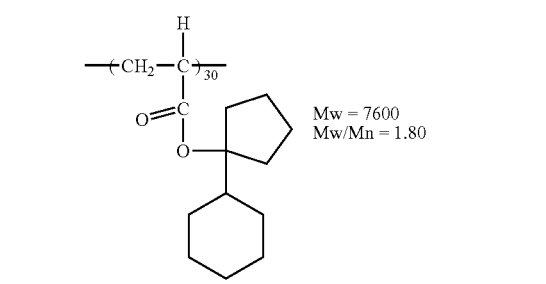
Mw = 7600
Mw/Mn = 1.80
(RA-8)
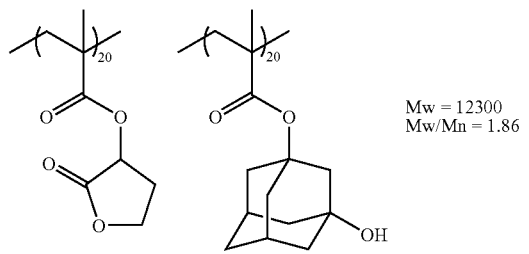
Mw = 12300
Mw/Mn = 1.86
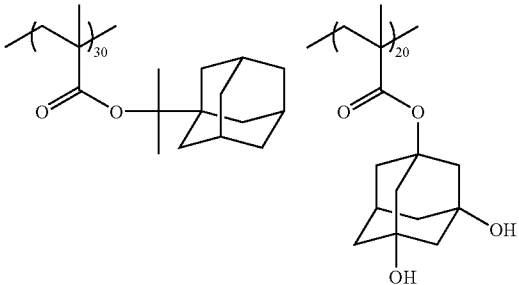

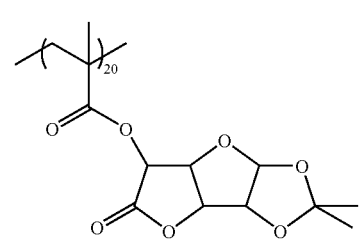
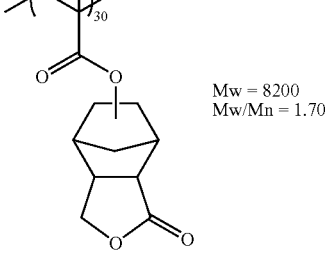
(RA-9)
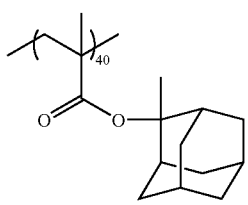
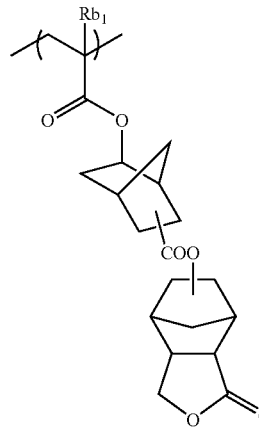
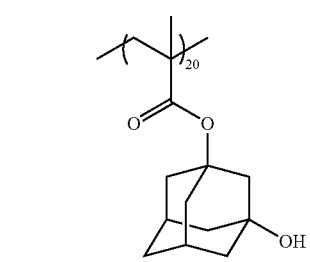
(RA-10)
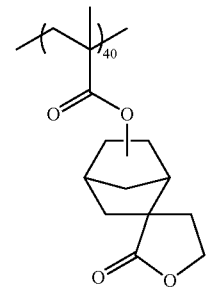
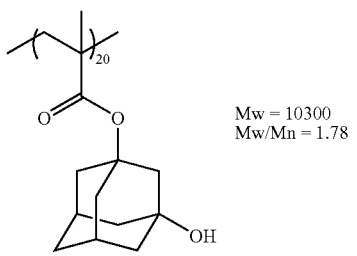
Mw = 10300
Mw/Mn = 1.78
(RA-11)
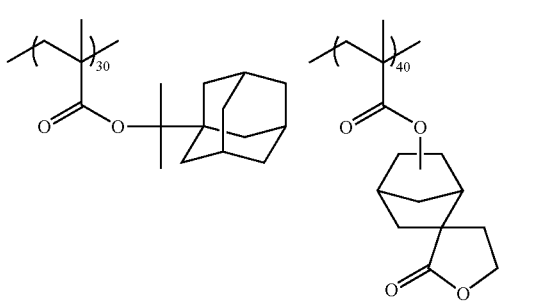
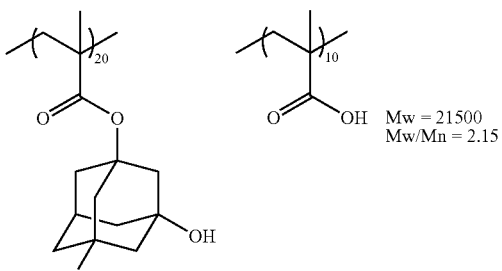
Mw = 21500
Mw/Mn = 2.15
(RA-12)
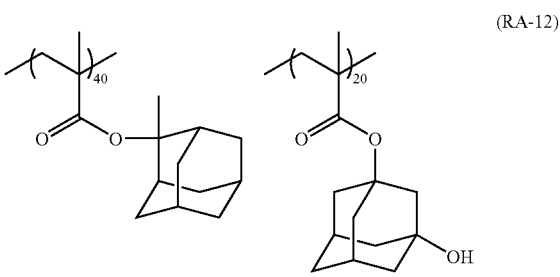
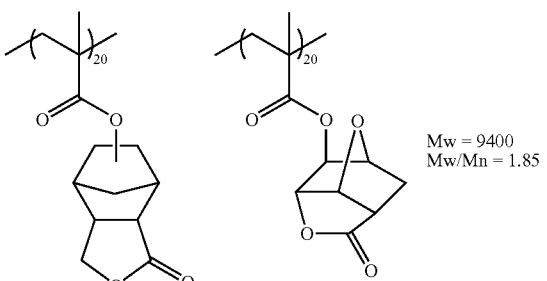
Mw = 9400
Mw/Mn = 1.85
Resin used in Comparative Example (Q1)
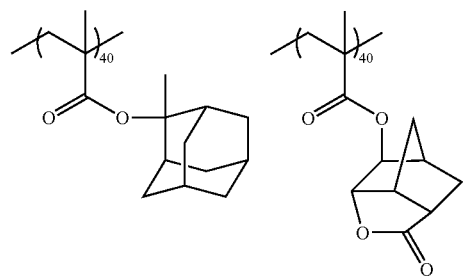
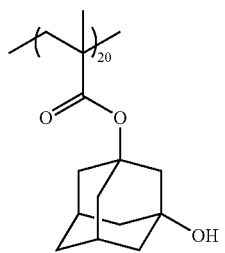
Mw = 10100
Mw/Mn = 1.79
(RA-13)
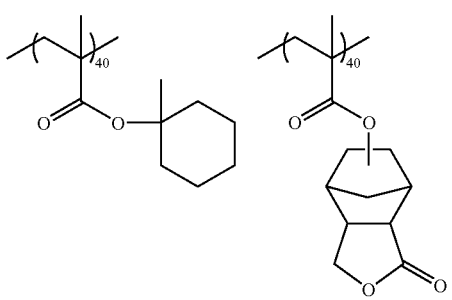
Mw = 7400
Mw/Mn = 1.76
(RA-14)
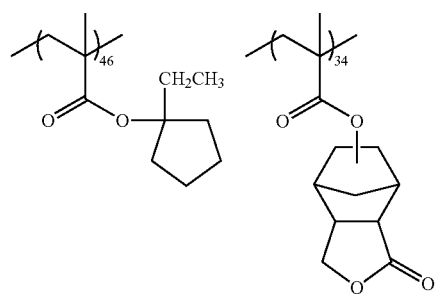
Mw = 8200
Mw/Mn = 1.79
(RA-15)
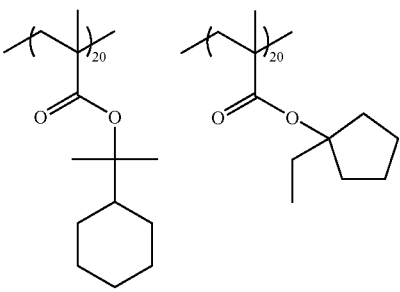
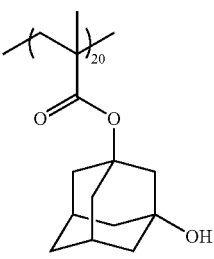
Mw = 5300
Mw/Mn = 1.60
(RA-16)
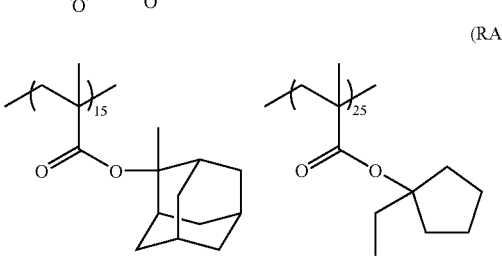
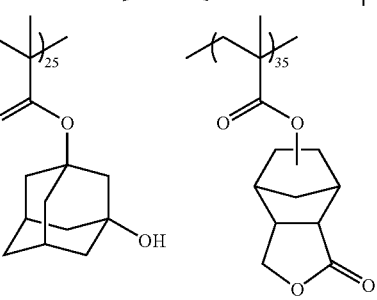
Mw = 12100
Mw/Mn = 1.90
(R-17)
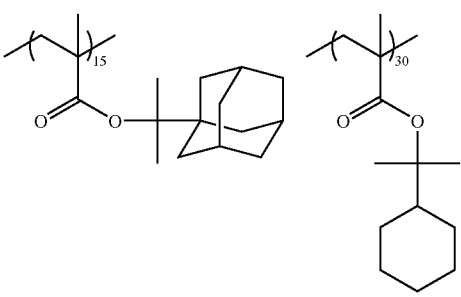
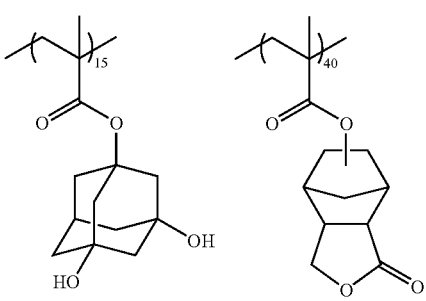
Mw = 9700
Mw/Mn = 1.88

-continued

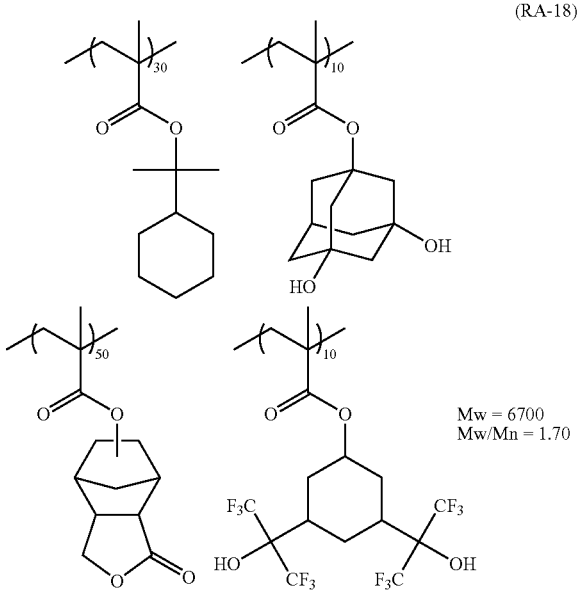

(RA-18)

Mw = 6700
Mw/Mn = 1.70

Examples 1 to 18 and Comparative Examples 1 to 3

Preparation of Resist:

The components shown in Table 1 below were dissolved in a solvent to prepare a solution having solids concentration of 8 mass %, and the solution was filtered through a polyethylene filter having a pore diameter of 0.03 μm, whereby a positive resist solution was prepared. The prepared positive resist solution was evaluated by the method described below. The results of evaluation are shown in Table 1 below.

The abbreviations in Table 1 are as follows.
PAG-A: Triphenylsulfonium nonafluorobutane sulfonate
N-1: Trioctylamine
N-2: 2,6-Diisopropylaniline
N-3: N-Phenyldiethanolamine
N-4: Diazabicyclo[4.3.0]nonene
N-5: Dicyclohexylmethylamine
N-6: 2,4,5-Triphenylimidazole
N-7: Dimethylaminopyridine
W-1: Megafac F176 (fluorine, manufactured by Dainippon Ink and Chemicals Inc.)
W-2: Megafac $R_{08}$ (fluorine and silicon, manufactured by Dainippon Ink and Chemicals Inc.)
W-3: Polysiloxane polymer KP-341 (silicon, manufactured by Shin-Etsu Chemical Co., Ltd.)
W-4: Troy Sol S-366 (manufactured by Troy Chemical Co., Ltd.)
SL-1: Cyclohexanone
SL-2: Propylene glycol monomethyl ether acetate
SL-3: Ethyl lactate
SL-4: Propylene glycol monomethyl ether
SL-5: γ-Butyrolactone In Table 1, the ratio of solvents in the case of using a plurality of solvents is a mass ratio.

Evaluation of Resist:

ARC29A (manufactured by Brewer Science) was uniformly coated in a thickness of 78 nm by a spin coater on a silicone wafer, dried by heating at 205° C. for 60 seconds, whereby an antireflection film was formed. After that, each positive resist solution immediately after preparation was coated thereon by a spin coater and dried at 115° C. for 90 seconds (PB) to form a resist film having a thickness of 200 nm.

The resist film was subjected to exposure through a mask with an ArF excimer laser stepper (manufactured by ASML

TABLE 1

| Ex. No. | (A) Resin (10 g) | (B) Light-Acid Generator (g) | Basic Compound (g) | Surfactant (0.02 g) | Solvent | Pattern Collapse (nm) | Line Edge Roughness (nm) |
|---|---|---|---|---|---|---|---|
| Ex. 1 | Ra-1 | A2-II-4 (0.4) | N-1 (0.03) | W-1 | SL-2/4 = 60/40 | 60 | 5.2 |
| Ex. 2 | Ra-2 | A2-II-16 (0.4) | N-2 (0.01) | W-2 | SL-1/2 = 40/60 | 60 | 5.7 |
| Ex. 3 | Ra-3 | A2-II-9 (0.6) | N-3 (0.025) | W-3 | SL-1/2 = 95/5 | 60 | 5.4 |
| Ex. 4 | Ra-4 | A2-II-3 (0.4) | N-4 (0.02) | W-4 | SL-2/4 = 80/20 | 65 | 6.0 |
| Ex. 5 | Ra-5 | A2-II-14 (0.2) z7 (0.2) | N-2 (0.01) N-3 (0.01) | W-4 | SL-1/2 = 70/30 | 55 | 5.0 |
| Ex. 6 | Ra-6 | A2-II-4 (0.4) | N-6 (0.03) | W-4 | SL-2/4 = 40/60 | 60 | 5.1 |
| Ex. 7 | Ra-7 | A2-II-2 (0.4) | N-7 (0.01) | W-1 | SL-2/4 = 60/40 | 65 | 5.9 |
| Ex. 8 | Ra-8 | A2-II-4 (0.4) | N-1 (0.02) | W-1 | SL-1/2 = 70/30 | 60 | 5.2 |
| Ex. 9 | Ra-9 | A2-III-2 (0.2) z27 (0.1) | N-2 (0.015) | W-1 | SL-2/3 = 90/10 | 65 | 6.2 |
| Ex. 10 | Ra-10 | A2-II-4 (0.4) | N-3 (0.02) | W-4 | SL-2/4 = 60/40 | 60 | 5.4 |
| Ex. 11 | Ra-11 | A2-II-4 (0.1) z2 (0.2) | N-1 (0.025) | W-3 | SL-2/5 = 95/5 | 55 | 5.0 |
| Ex. 12 | Ra-12 | A2-II-15 (0.3) z5 (0.1) | N-1 (0.01) N-3 (0.01) | W-4 | SL-1/2 = 60/40 | 65 | 5.6 |
| Comp. Ex. 1 | Q1 | A2-II-4 (0.4) | N-1 (0.03) | W-1 | SL-2/4 = 60/40 | 70 | 7.1 |
| Comp. Ex. 2 | Ra-1 | PAG-A (0.4) | N-1 (0.03) | W-1 | SL-2/4 = 60/40 | 70 | 7.3 |
| Comp. Ex. 3 | Q1 | PAG-A (0.4) | N-1 (0.03) | W-1 | SL-2/4 = 60/40 | 75 | 9.1 |
| Ex. 13 | Ra-13 | A2-II-4 (0.3) | N-1 (0.03) | W-1 | SL-2/4 = 60/40 | 55 | 4.8 |
| Ex. 14 | Ra-14 | A2-II-4 (0.4) | N-2 (0.04) | W-2 | SL-1/2 = 40/60 | 55 | 5.0 |
| Ex. 15 | Ra-15 | A2-II-4 (0.4) | N-3 (0.035) | W-3 | SL-2/5 = 95/5 | 55 | 4.7 |
| Ex. 16 | Ra-16 | A2-II-4 (0.5) | N-4 (0.04) | W-4 | SL-2/4 = 80/20 | 55 | 4.9 |
| Ex. 17 | Ra-17 | A2-II-4 (0.4) | N-2 (0.02) N-3 (0.02) | W-4 | SL-1/2 = 30/70 | 55 | 4.8 |
| Ex. 18 | Ra-18 | A2-II-4 (0.4) | N-6 (0.03) | W-4 | SL-2/4 = 60/40 | 55 | 4.9 |

Co., PAS 5500/1100, NA=0.75 (2/3 zonal lighting)), and the exposed resist film was heated on a hot plate at 120° C. for 60 seconds (PEB) immediately after exposure. Further, the resist film was developed with a 2.38 mass % tetramethylammonium hydroxide aqueous solution at 23° C. for 60 seconds, rinsed with pure water for 30 seconds, and then dried, whereby a resist pattern was obtained.

Pattern Collapse:

With the exposure amount to reproduce a mask pattern of line and space of 1/1 of 90 nm being optimal exposure amount, and when the exposure amount was further increased to make the pattern thin, the line width resolved without causing pattern collapse was defined as the critical pattern collapse. The smaller the value, the pattern is resolved without collapsing, that is, pattern collapse resistance is good.

Line Edge Roughness:

Line edge roughness was measured by the observation of a pattern of line and space of 1/1 of 90 nm with a scanning electron microscope (SEM). The distance from the intrinsic base line of the edge in the machine direction of the line pattern in the range of 5 μm was measured at 50 points with an SEM (S-8840, manufactured by Hitachi, Ltd.), and standard deviation was found and 3σ was computed. The smaller the value, the better is the performance.

From the results in Table 1, it can be seen that the positive photosensitive compositions in the invention are excellent in pattern collapse resistance and exhibit satisfactory line edge roughness.

Immersion Exposure:
Preparation of Resist:

The components in Examples 1 to 18 were respectively dissolved in a solvent to prepare a solution having solids concentration of 7 mass %, and each solution was filtered through a polyethylene filter having a pore diameter of 0.1 μm, whereby a positive resist solution was prepared. The prepared positive resist solution was evaluated by the method described below.

Evaluation of Resolution:

An organic antireflection film coating solution ARC29A (manufactured by Nissan Chemical Industries Ltd.) was coated on a silicon wafer and baked at 205° C. for 60 seconds to form an antireflection film having a thickness of 78 nm. Each resist composition prepared above was coated on the antireflection film and baked at 115° C. for 60 seconds, whereby a resist film having a thickness of 150 nm was formed. The wafer obtained was subjected to two-beam interference exposure (wet exposure) with pure water as the immersion liquid. In the two-beam interference exposure (wet exposure), as shown in FIG. 1, laser 1, diaphragm 2, shutter 3, three reflection mirrors 4, 5 and 6, and condenser lens 7 were used, and wafer 10 having the antireflection film and the resist film was subjected to exposure via prism 8 and immersion liquid (pure water) 9. The wavelength of 193 nm was used as laser 1, and prism 8 for forming a line and space pattern of 65 nm was used. Immediately after exposure, the wafer was baked at 115° C. for 60 seconds, and then subjected to development with a tetramethylammonium hydroxide aqueous solution (2.38%) for 60 seconds, rinsing with pure water, and drying by spinning. A line and space pattern (1/1) of 65 nm was resolved as the obtained resist pattern was observed with a scanning electron microscope (S-9260, manufactured by Hitachi, Ltd.).

It is apparently seen that the positive photosensitive compositions in the invention have a good image-forming property also in the exposure method via the immersion liquid.

This application is based on Japanese patent application JP 2005-068920, filed on Mar. 11, 2005, the entire content of which is hereby incorporated by reference, the same as if set forth at length.

What is claimed is:

1. A positive photosensitive composition comprising:

(A) a resin having at least one repeating unit having a lactone structure at a side chain, at least one repeating unit having an alicyclic hydrocarbon structure substituted with a polar group represented by the following formulae (VIIa) or (VIIb), and at least one acid-decomposable repeating unit selected from the group consisting of four acid-decomposable units 13, 14, 15 and 19 shown below, the resin being capable of decomposing by the action of an acid to increase the solubility in an alkali developer, in which the lactone structure is represented by any of the following formulae (I-1) to (I-4); and (B) a compound capable of generating an acid represented by the following formula (II-1) or (II-2) upon irradiation with an actinic ray or a radiation:

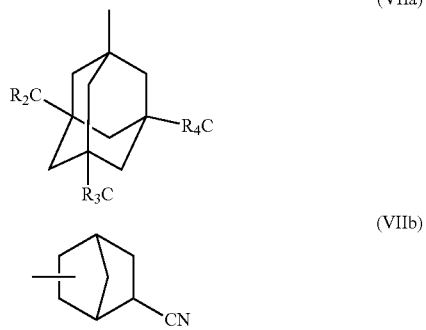

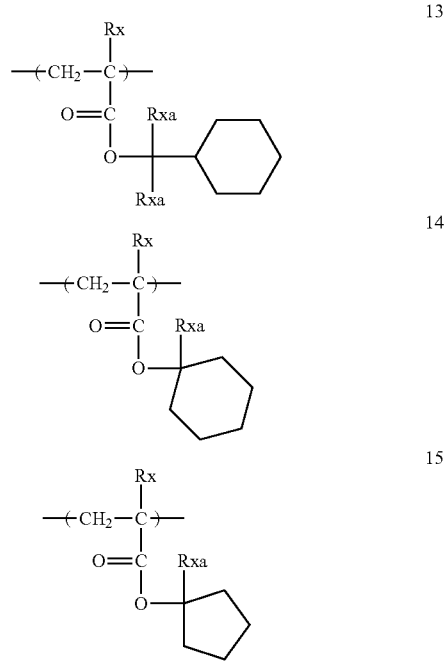

-continued

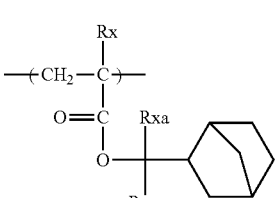
(19)

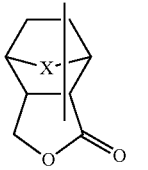
(I-1)

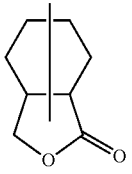
(I-2)

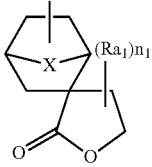
(I-3)

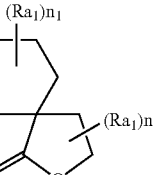
(I-4)

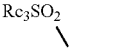
(II-1)

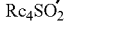
(II-2)

in formula (VIIa), $R_{2c}$, $R_{3c}$ and $R_{4c}$ each represents a hydrogen atom, a hydroxyl group, or a cyano group, provided that at least one of $R_{2c}$, $R_{3c}$ and $R_{4c}$ represents a hydroxyl group or a cyano group;

in formulae 13, 14, 15 and 19, Rx represents H, $CH_3$, $CF_3$, $CH_2OH$ or Rxa, and Rxa represents an alkyl group having from 1 to 4 carbon atoms;

in formulae (I-1) to (I-4), $Ra_1$ each represents an organic group; X represents $-CH_2-$, $-CH_2CH_2-$, or an oxygen atom; and $n_1$ represents an integer of from 0 to 3;

in formulae (II-1) and (II-2), $Rc_3$, $Rc_4$ and $Rc_5$ each represents an organic group, and $Rc_3$ and $Rc_4$ may be bonded to form a ring.

2. The positive photosensitive composition as claimed in claim 1, wherein the resin (A) is a resin having at least one repeating unit having a structure represented by any of the following formulae (I-1a) to (I-4a):

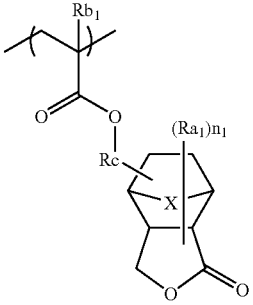
(I-1a)

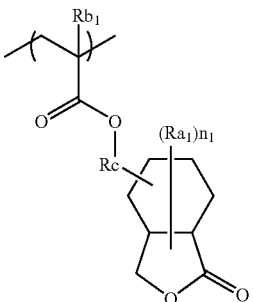
(I-2a)

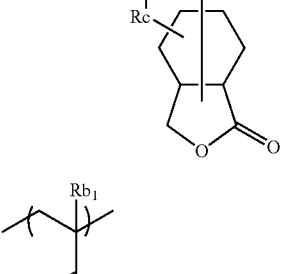
(I-3a)

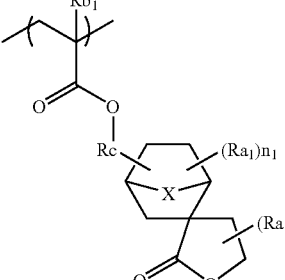
(I-4a)

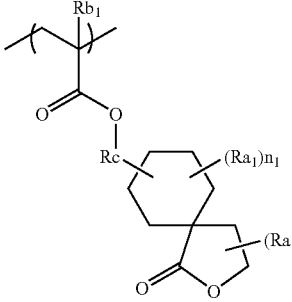

wherein $Rb_1$ represents a hydrogen atom, an alkyl group, or $-CH_2-O-Rb_2$; $Rb_2$ represents a hydrogen atom, an alkyl group, a cycloalkyl group, an acyl group, or a group having a lactone structure; Rc represents a single bond or a divalent linking group; $Ra_1$ represents an organic group; X represents $-CH_2-$, $-CH_2CH_2-$, or an oxygen atom; and $n_1$ represents an integer of from 0 to 3.

3. The positive photosensitive composition as claimed in claim 1, wherein the compound (B) is a sulfonium salt or an iodonium salt of the acid represented by formula (II-1) or (II-2).

4. The positive photosensitive composition as claimed in claim 1, wherein the compound (B) is a compound capable of generating an acid represented by formula (II-1) or (II-2) in which $Rc_3$ and $Rc_4$ are bonded to each other and forming a ring.

5. The positive photosensitive composition as claimed in claim 1, which further comprises a compound capable of generating a sulfonic acid upon irradiation with an actinic ray or a radiation.

6. The positive photosensitive composition as claimed in claim 1, wherein the resin (A) further contains at least one acid-decomposable repeating unit having an adamantane structure.

7. The positive photosensitive composition as claimed in claim 1, wherein the resin (A) further contains a repeating unit having an alkali-soluble group.

8. The positive photosensitive composition as claimed in claim 1, wherein the resin (A) further contains a repeating unit having from 1 to 3 groups represented by formula (F1):

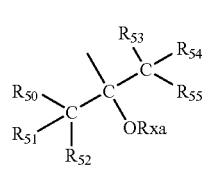

(F1)

wherein $R_{50}$, $R_{51}$, $R_{52}$, $R_{53}$, $R_{54}$ and $R_{55}$ each represents a hydrogen atom, a fluorine atom, or an alkyl group, provided that at least one of $R_{50}$ to $R_{55}$ represents a fluorine atom, or an alkyl group in which at least one hydrogen atom is substituted with a fluorine atom; and Rxa represents a hydrogen atom or an organic group.

9. A pattern-forming method comprising: forming a film with the positive photosensitive composition as claimed in claim 1; and exposing and developing the film.

10. The positive photosensitive composition as claimed in claim 1, wherein the resin (A) further contains at least one repeating unit represented by the following formula (AI),

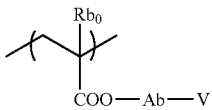

(AI)

in formula (AI), $Rb_0$ represents a hydrogen atom, a halogen atom, or an alkyl group having from 1 to 4 carbon atoms; Ab represents an alkylene group, a divalent linking group having a monocyclic or polycyclic alicyclic hydrocarbon structure, a single bond, an ether group, an ester group, a carbonyl group, a carboxyl group, or a divalent linking group combining these groups; and V represents a group represented by any of the following formulae (LC1-1) to (LC1-12):

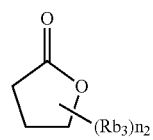

LC1-1

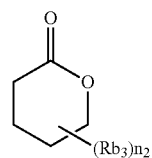

LC1-2

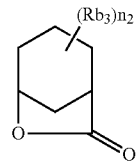

LC1-3

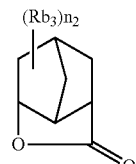

LC1-4

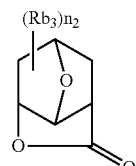

LC1-5

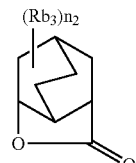

LC1-6

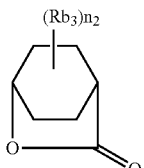

LC1-7

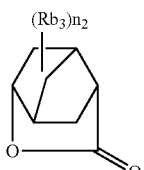

LC1-8

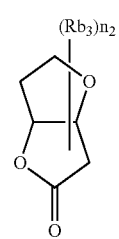

LC1-9

LC1-10

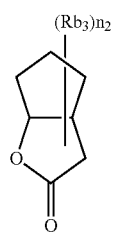

LC1-11

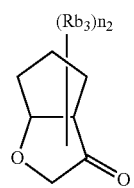

LC1-12

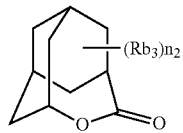

in formulae (LC1-1) to (LC1-12), $Rb_3$ represents an alkyl group having from 1 to 8 carbon atoms, a cycloalkyl group having from 4 to 7 carbon atoms, an alkoxyl group having from 1 to 8 carbon atoms, an alkoxycarbonyl group having from 1 to 8 carbon atoms, a carboxyl group, a halogen atom, a hydroxyl group, a cyano group, and an acid-decomposable group; and $n_2$ represents an integer of from 0 to 4, provided that when $n_2$ represents 2 or more, a plurality of $Rb_3$ may be the same or different, or a plurality of $Rb_3$ may be bonded to each other to form a ring.

11. An immersion exposure method comprising exposing a film made with the positive photosensitive composition as claimed in claim 1 in an immersion liquid.

12. The positive photosensitive composition as claimed in claim 1, wherein the resin (A) is a resin having at least one acid-decomposable repeating unit selected from the group consisting of acid-decomposable units 13, 14 and 15 shown below:

13

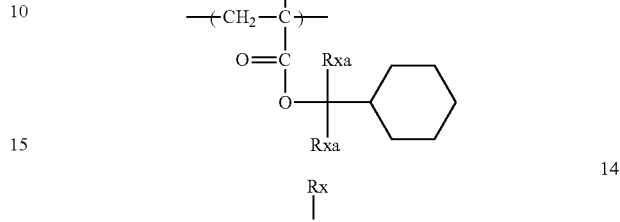

14

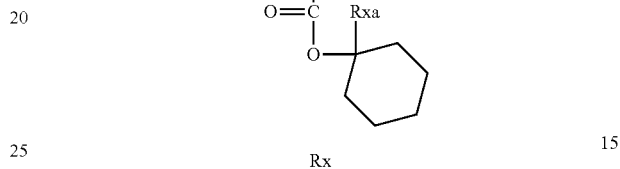

15

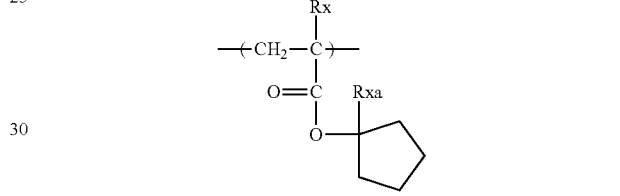

wherein Rx represents H, $CH_3$, $CF_3$, $CH_2OH$ or Rxa, and Rxa represents an alkyl group having from 1 to 4 carbon atoms.

\* \* \* \* \*